United States Patent
Salamat et al.

(10) Patent No.: US 11,791,838 B2
(45) Date of Patent: Oct. 17, 2023

(54) NEAR-STORAGE ACCELERATION OF DICTIONARY DECODING

(71) Applicant: Samsung Electronics Co., Ltd., Suwon-si (KR)

(72) Inventors: Sahand Salamat, San Diego, CA (US); Joo Hwan Lee, San Jose, CA (US); Armin Haj Aboutalebi, San Jose, CA (US); Praveen Krishnamoorthy, Fremont, CA (US); Xiaodong Zhao, Cupertino, CA (US); Hui Zhang, San Jose, CA (US); Yang Seok Ki, Palo Alto, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/357,953

(22) Filed: Jun. 24, 2021

(65) Prior Publication Data

US 2022/0231698 A1    Jul. 21, 2022

Related U.S. Application Data

(60) Provisional application No. 63/138,165, filed on Jan. 15, 2021.

(51) Int. Cl.
*H03M 7/30* (2006.01)
*G06F 3/06* (2006.01)

(52) U.S. Cl.
CPC ........ *H03M 7/3088* (2013.01); *G06F 3/0608* (2013.01); *G06F 3/0644* (2013.01); *G06F 3/0659* (2013.01); *G06F 3/0673* (2013.01)

(58) Field of Classification Search
CPC .. H03M 7/3088; G06F 3/0608; G06F 3/0644; G06F 3/0659; G06F 3/0673
See application file for complete search history.

(56) References Cited

U.S. PATENT DOCUMENTS

| | | |
|---|---|---|
| 5,408,234 A | 4/1995 | Chu |
| 5,635,932 A | 6/1997 | Shinagawa et al. |

(Continued)

FOREIGN PATENT DOCUMENTS

| | | |
|---|---|---|
| WO | 2009005758 A2 | 1/2009 |
| WO | 2016194401 A1 | 12/2016 |

OTHER PUBLICATIONS

An article titled "Condensed Table of Huffman Coding, a New Approach to Efficient Decoding" by Reza Hashemian, Life Member, IEEE published in the IEEE Transactions on Communications, vol. 52, No. 1, Jan. 2004. (Year: 2004).*

(Continued)

*Primary Examiner* — Tim T Vo
*Assistant Examiner* — Janice M. Girouard
(74) *Attorney, Agent, or Firm* — Renaissance IP Law Group LLP

(57) ABSTRACT

An accelerator is disclosed. The accelerator may include a memory that may store a dictionary table. An address generator may be configured to generate an address in the dictionary table based on an encoded value, which may have an encoded width. An output filter may be configured to filter a decoded value from the dictionary table based on the encoded value, the encoded width, and a decoded width of the decoded data. The accelerator may be configured to support at least two different encoded widths.

24 Claims, 14 Drawing Sheets

(56) References Cited

U.S. PATENT DOCUMENTS

| | | | |
|---|---|---|---|
| 7,071,854 | B1 | 7/2006 | Cardosa et al. |
| 7,079,054 | B2 | 7/2006 | Chu |
| 8,456,331 | B2 | 6/2013 | Carlson |
| 8,847,798 | B2 | 9/2014 | Pell et al. |
| 10,177,782 | B2 | 1/2019 | Satpathy et al. |
| 10,361,715 | B1 | 7/2019 | Whiteside |
| 10,367,604 | B2 | 7/2019 | Martin |
| 10,491,240 | B1 | 11/2019 | Dupont et al. |
| 10,693,493 | B1 | 6/2020 | Abali et al. |
| 10,727,865 | B2 | 7/2020 | Beckman et al. |
| 10,812,630 | B2 | 10/2020 | Beckman et al. |
| 10,862,513 | B2 | 12/2020 | Thomas et al. |
| 2006/0106870 | A1 | 5/2006 | Franaszek et al. |
| 2010/0223237 | A1 | 9/2010 | Mishra et al. |
| 2010/0332700 | A1 | 12/2010 | Fallon |
| 2014/0032516 | A1* | 1/2014 | Sukhwani ............ G06F 16/211 707/705 |
| 2020/0159859 | A1 | 5/2020 | Beckman et al. |
| 2020/0192880 | A1 | 6/2020 | Hashemi et al. |
| 2020/0274552 | A1 | 8/2020 | Rigo et al. |

OTHER PUBLICATIONS

A screen shot of the Storage Networking Industry Associaition (SNIA) dictionary pages for the letter "s" that includes a definition of a "storage device". The screen shot is a capture of the page taken Oct. 8, 2019 by the Wayback Machine. (Year: 2019).*
European Extended Search Report for Application No. 21203407.8, dated Apr. 4, 2022.
Wikipedia, "Huffman Coding," Dec. 27, 2020, pp. 1-11, XP055904037, retrieved from the Internet: URL: https://en.wikipedia.org/w/index.php?title=Huffman_coding&oldid=996604122 [retrieved on Mar. 22, 2022].
"Scaleflux", http://www.scaleflux.com/. Accessed: Jun. 1, 2022.
"Smartssd", https://samsungsemiconductor-us.com/smartssd/, Accessed: Jun. 1, 2022.
"Tpcc benchmark." http://www.tpc.org/tpcc/. Accessed: May 27, 2020.
"White paper: Smarter data storage, a guide to computational storage on arm", tech. rep., Arm, Sep. 2019.
Asiatici, Mikhail et al., "FPGAs in the Datacenters: the Case of Parallel Hybrid Super Scalar String Sample Sort", 2020 IEEE 31st International Conference on Application-specific Systems, Architectures and Processors (ASAP), 2020, pp. 133-140.
Batcher, K. E., "Sorting networks and their applications", AFIPS '68 (Spring): Proceedings of the Apr. 30-May 2, 1968, spring joint computer conference, Apr. 1968, pp. 307-314.
Bingmann, Timo et al., "Parallel string sample sort", in European Symposium on Algorithms, pp. 169-180, Springer, 2013.
Boicu, Ionut, "Adaptive on-the-fly compressed execution in spark", 2019.
Chen, Han et al., "FPGA-Accelerated Samplesort for Large Data Sets", FPGA '20: Proceedings of the 2020 ACM/SIGDA International Symposium on Field-Programmable Gate Arrays, Feb. 2020, pp. 222-232.
Chen, Ren et al., "Energy and Memory Efficient Mapping of Bitonic Sorting on FPGA", FPGA '15: Proceedings of the 2015 ACM/SIGDA International Symposium on Field-Programmable Gate Arrays, Feb. 2015, pp. 240-249.
Dehon, Andre, "The density advantage of configurable computing", in Computer, vol. 33, No. 4, pp. 41-49, Apr. 2000.
Do, Jaeyoung et al., "Query processing on smart SSDs: opportunities and challenges", SIGMOD '13: Proceedings of the 2013 ACM SIGMOD International Conference on Management of Data, Jun. 2013, pp. 1221-1230.
Francisco, Phil, "Ibm puredata system for analytics architecture", IBM Redbooks, pp. 1-16, 2014.
Graefe, Goetz, "Implementing sorting in database systems", ACM Computing Surveys, vol. 38, Issue 3, 2006, pp. 10-es.
Gu, Boncheol et al., "Biscuit: A Framework for Near-Data Processing of Big Data Workloads", 2016 ACM/IEEE 43rd Annual International Symposium on Computer Architecture (ISCA), 2016, pp. 153-165.
Hematian, Amirshahram et al., "Zero-delay FPGA-based odd-even sorting network", 2013 IEEE Symposium on Computers & Informatics (ISCI), 2013, pp. 128-131.
Jo, Insoon et al., "YourSQL: a high-performance database system leveraging in-storage computing", Proceedings of the VLDB Endowment, vol. 9, Issue 12, Aug. 2016, pp. 924-935.
Koch, Dirk et al., "FPGASort: a high performance sorting architecture exploiting run-time reconfiguration on fpgas for large problem sorting", FPGA '11: Proceedings of the 19th ACM/SIGDA international symposium on Field programmable gate arrays, Feb. 2011, pp. 45-54.
Koo, Gunjae et al., "Summarizer: Trading Communication with Computing Near Storage", 2017 50th Annual IEEE/ACM International Symposium on Microarchitecture (MICRO), 2017, pp. 219-231.
Kumar, Dinesh et al., "A survey: classification of big data", Cognitive Informatics and Soft Computing, pp. 299-306, Springer, 2019.
Lagrange, Veronica et al., "Modeling Analytics for Computational Storage", ICPE '20: Proceedings of the ACM/SPEC International Conference on Performance Engineering, Apr. 2020, pp. 88-99.
Lee, Jinho et al., "ExtraV: boosting graph processing near storage with a coherent accelerator", Proceedings of the VLDB Endowment, vol. 10, Issue 12, Aug. 2017, pp. 1706-1717.
Li, Jing et al., "HippogriffDB: balancing I/O and GPU bandwidth in big data analytics", Proceedings of the VLDB Endowment, vol. 9, Issue 14, Oct. 2016, pp. 1647-1658.
Lipu, Ashrak Rahman et al., "Exploiting parallelism for faster implementation of Bubble sort algorithm using FPGA", 2016 2nd International Conference on Electrical, Computer & Telecommunication Engineering (ICECTE), 2016, pp. 1-4.
Liu, Chunwei et al., "Mostly Order Preserving Dictionaries", 2019 IEEE 35th International Conference on Data Engineering (ICDE), 2019, pp. 1214-1225.
Mueller, Rene et al., "Sorting networks on fpgas", The VLDB Journal, vol. 21, No. 1, pp. 1-23, 2012.
Pei, Shuyi et al., "Registor: A Platform for Unstructured Data Processing Inside SSD Storage", ACM Transactions on Storage, vol. 15, Issue 1, Feb. 2019, Article No. 7, pp. 1-24.
Ruan, Zhenyuan et al., "Analyzing and Modeling In-Storage Computing Workloads On EISC—An FPGA-Based System-Level Emulation Platform", 2019 IEEE/ACM International Conference on Computer-Aided Design (ICCAD), 2019, pp. 1-8.
Ruan, Zhenyuan et al., "INSIDER: designing in-storage computing system for emerging high-performance drive", USENIX ATC '19: Proceedings of the 2019 USENIX Conference on Usenix Annual Technical Conference, Jul. 2019, pp. 379-394.
Salamat, Sahand et al., "RNSnet: In-Memory Neural Network Acceleration Using Residue Number System", 2018 EEE International Conference on Rebooting Computing (ICRC), 2018, pp. 1-12.
Wang, Jianguo et al., "SSD in-storage computing for list intersection", DaMoN '16: Proceedings of the 12th International Workshop on Data Management on New Hardware, Jun. 2016, Article No. 4, pp. 1-7.

* cited by examiner

FIG. 10C

NEAR-STORAGE ACCELERATION OF DICTIONARY DECODING

RELATED APPLICATION DATA

This application claims the benefit of U.S. Provisional Patent Application Ser. No. 63/138,165, filed Jan. 15, 2021, which is incorporated by reference herein for all purposes.

FIELD

The disclosure relates generally to storage devices, and more particularly to performing dictionary decoding near the storage device.

BACKGROUND

Database management systems (and other storage systems) may use data encoding to compress the stored data into the storage devices. To save storage space, data may be stored in a compressed manner. Compressing the data generally involves storing the data in a format that differs in some way from the original data, while still representing the original data (for lossless compression) or something close to the original data (for lossy compression). While some operations may be run on the encoded data, running different database operations may require the data to be decoded first. Performing this decoding in the host processor may reduce the ability of the host processor to execute other commands.

A need remains to improve host processor performance when data is dictionary encoded.

BRIEF DESCRIPTION OF THE DRAWINGS

The drawings described below are examples of how embodiments of the disclosure may be implemented, and are not intended to limit embodiments of the disclosure. Individual embodiments of the disclosure may include elements not shown in particular figures and/or may omit elements shown in particular figures. The drawings are intended to provide illustration and may not be to scale.

FIG. 10A shows one way data may be stored in and retrieved from the dictionary table of FIG. 7, according to embodiments of the disclosure.

FIG. 10B shows a second way data may be stored in and retrieved from the dictionary table of FIG. 7, according to embodiments of the disclosure.

FIG. 10C shows a third way data may be stored in and retrieved from the dictionary table of FIG. 7, according to embodiments of the disclosure.

SUMMARY

Figure 1:
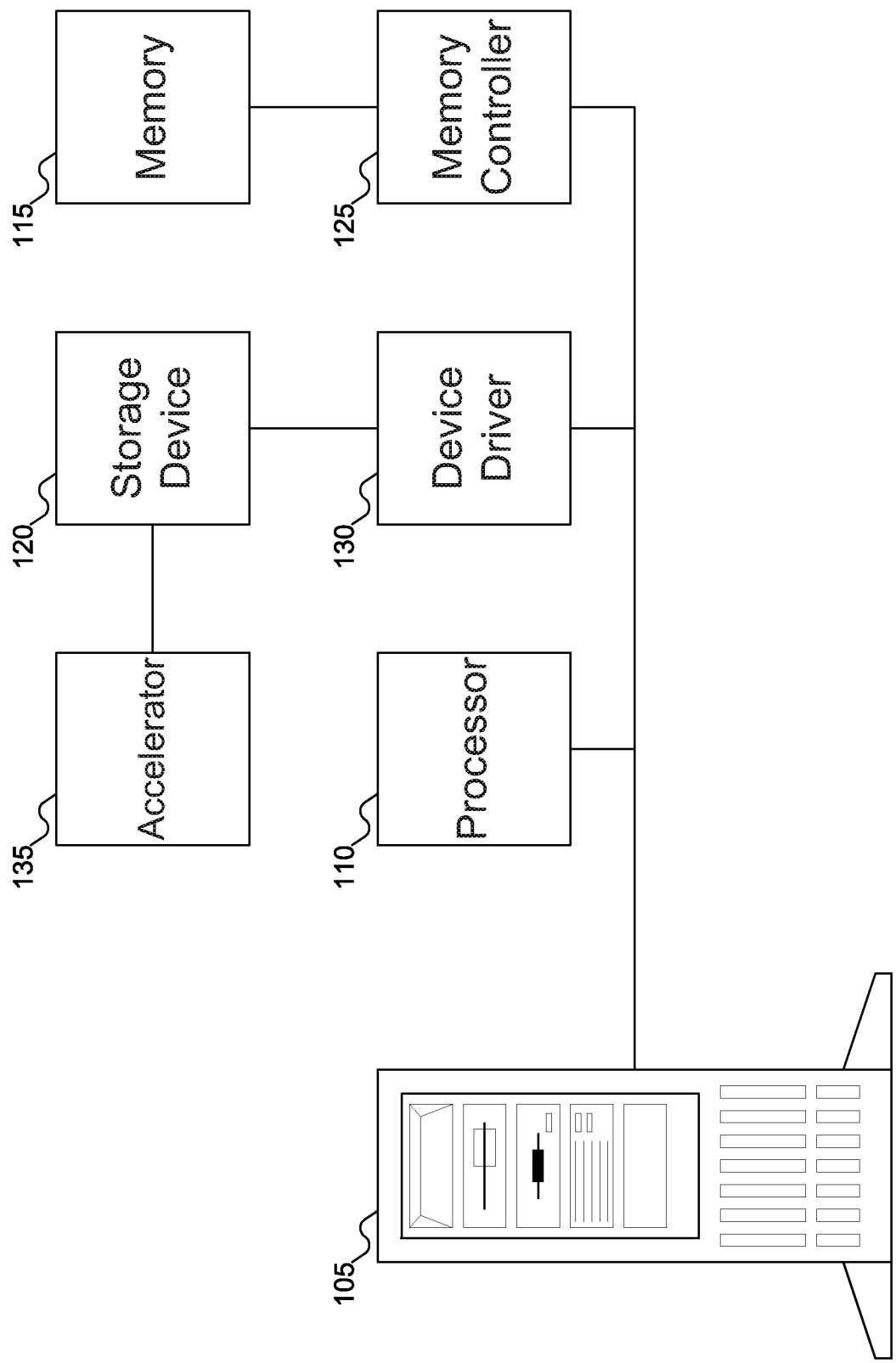
FIG. 1 shows a system including an accelerator to support dictionary decoding, according to embodiments of the disclosure.

Embodiments of the disclosure include an accelerator associated with a storage device. The accelerator may perform decoding of data that is stored in a dictionary encoded format. After decoding, the decoded data may be written back to the storage device or to Dynamic Random Access Memory (DRAM).

DETAILED DESCRIPTION

Reference will now be made in detail to embodiments of the disclosure, examples of which are illustrated in the accompanying drawings. In the following detailed description, numerous specific details are set forth to enable a thorough understanding of the disclosure. It should be understood, however, that persons having ordinary skill in the art may practice the disclosure without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the disclosure.

The terminology used in the description of the disclosure herein is for the purpose of describing particular embodiments only and is not intended to be limiting of the disclosure. As used in the description of the disclosure and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Database management systems (and other storage systems) may use data encoding to compress the stored data into the storage devices. Dictionary encoding may be a lossless one-to-one compression method that replaces attributes from a large domain with small numbers. To sort the database, if the data is stored in the encoded format, the table should be decoded and then sorted.

But transferring large amounts of data to a host processor to perform dictionary decoding as a preparatory step to other processing may consume resources (such as bus bandwidth and processing time) that might be used for other purposes. A computational storage devices device may support general purpose dictionary decoding of data stored in a storage device. With general purpose dictionary decoding, the same accelerator may be used to decode data encoded with two or more different dictionary encodings. The dictionary may encode fixed- or variable-width data. The dictionary may be loaded into the accelerator, after which the data may be read and decoded, then delivered to another processing unit for processing (such as sorting, filtering, etc.) or written back to the storage device (for later processing).

FIG. 1 shows a system including an accelerator to support dictionary decoding, according to embodiments of the disclosure. In FIG. 1, machine 105, which may also be termed a host, may include processor 110, memory 115, and storage device 120. Processor 110 may be any variety of processor. (Processor 110, along with the other components discussed below, are shown outside the machine for ease of illustration: embodiments of the disclosure may include these components within the machine.) While FIG. 1 shows a single processor 110, machine 105 may include any number of processors, each of which may be single core or multi-core processors, each of which may implement a Reduced Instruction Set Computer (RISC) architecture or a Complex Instruction Set Computer (CISC) architecture (among other possibilities), and may be mixed in any desired combination.

Processor 110 may be coupled to memory 115. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. Memory 115 may also be any desired combination of different memory types, and may be managed by memory controller 125.

Memory 115 may be used to store data that may be termed "short-term": that is, data not expected to be stored for extended periods of time. Examples of short-term data may include temporary files, data being used locally by applications (which may have been copied from other storage locations), and the like.

Processor 110 and memory 115 may also support an operating system under which various applications may be running. These applications may issue requests (which may also be termed commands) to read data from or write data to either memory 115 or storage device 120. Storage device 120 may be used, for example, to store initial parameters (or ranges of values for initial parameters, along with what types of behaviors the ranges of values represent) used to initialize the simulation. Storage device 120 may be accessed using device driver 130. While FIG. 1 uses the generic term "storage device", embodiments of the disclosure may include any storage device formats, examples of which may include hard disk drives and Solid State Drives (SSDs). Any reference to "SSD" below should be understood to include such other embodiments of the disclosure.

Machine 105 may also include accelerator 135. Accelerator 135 may be an accelerator that may perform dictionary decoding in support of operations performed on data stored in storage device 120. Accelerator 135 may be part of storage device 120, accelerator 135 may be directly connected to storage device 120 (but still a separate element), or accelerator 135 may be communicatively coupled to storage device 120 across, for example, a bus, such as a Peripheral Component Interconnect Express (PCIe) bus. By keeping accelerator 135 closer to storage device 120, the amount of data transferred to processor 110 may be reduced, which may increase the available bandwidth for data being sent to or from processor 110. Accelerator 135 is discussed further with reference to FIG. 7 below.

Figure 2:
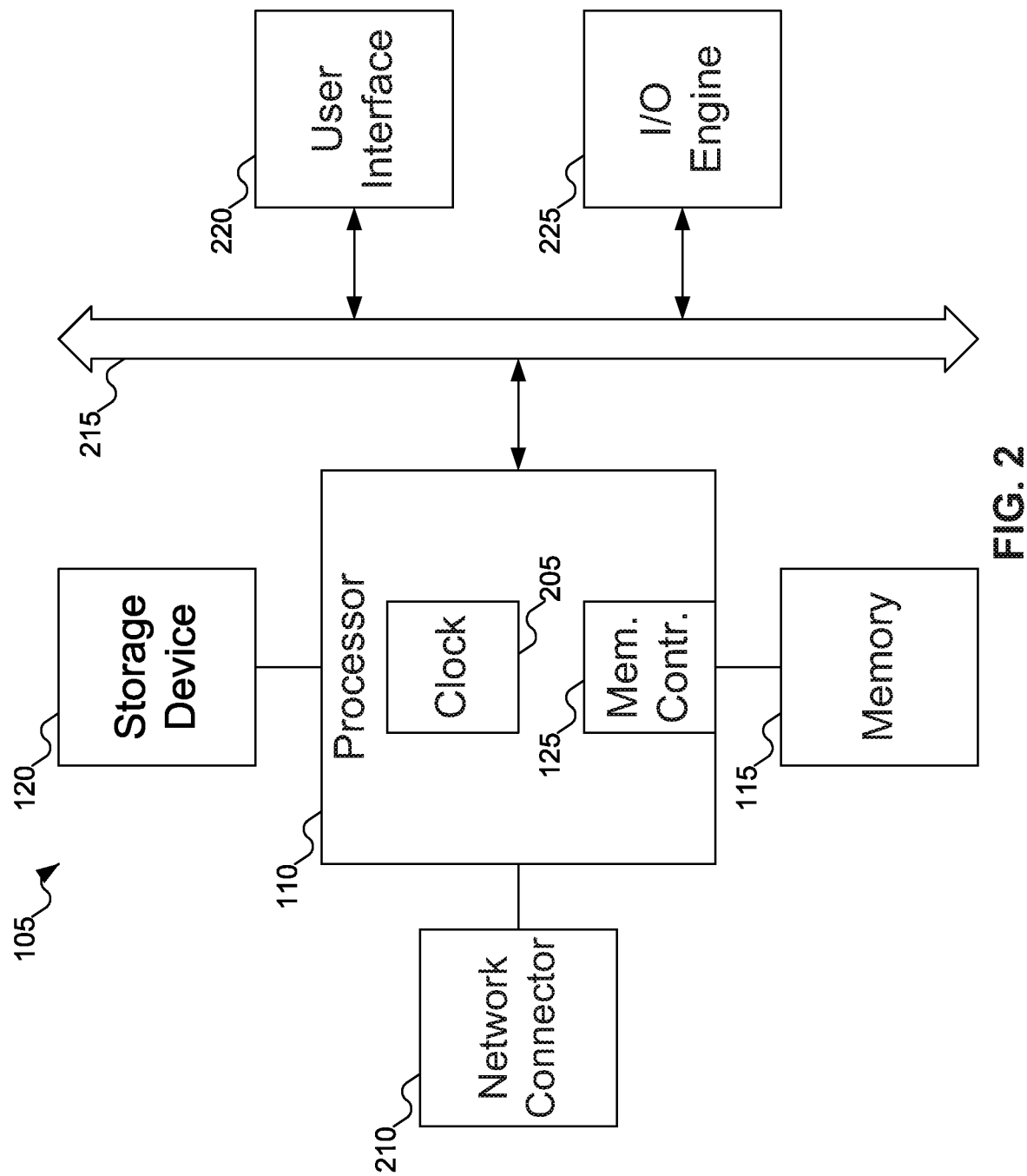
FIG. 2 shows details of the machine of FIG. 1, according to embodiments of the disclosure.

FIG. 2 shows details of machine 105 of FIG. 1, according to embodiments of the disclosure. In FIG. 2, typically, machine 105 includes one or more processors 110, which may include memory controllers 125 and clocks 205, which may be used to coordinate the operations of the components of the machine. Processors 110 may also be coupled to memories 115, which may include random access memory (RAM), read-only memory (ROM), or other state preserving media, as examples. Processors 110 may also be coupled to storage devices 120, and to network connector 210, which may be, for example, an Ethernet connector or a wireless connector. Processors 110 may also be connected to buses 215, to which may be attached user interfaces 220 and Input/Output (I/O) interface ports that may be managed using I/O engines 225, among other components.

Figure 3:
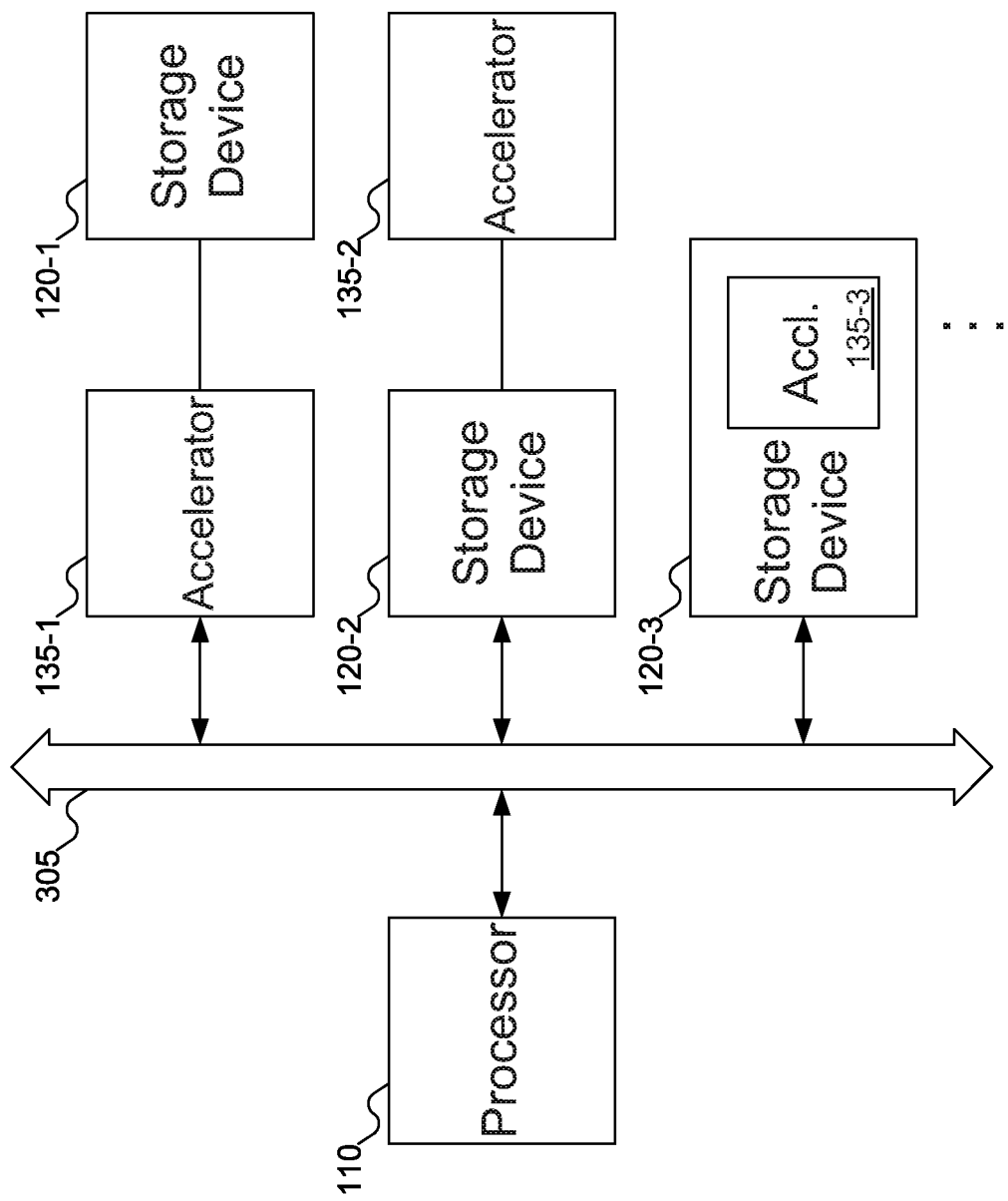
FIG. 3 shows an architecture for using the accelerator of FIG. 1 to support dictionary decoding in the storage device of FIG. 1, according to embodiments of the disclosure.

FIG. 3 shows an architecture for using the accelerator of FIG. 1 to support dictionary decoding in the storage device of FIG. 1, according to embodiments of the disclosure. In FIG. 3, processor 110 may be connected to multiple storage devices, each with its own accelerator. Thus, processor 110 may be connected to storage devices 120-1, 120-2, and 120-3 (which may be referred to collectively as storage device 120). Each storage device 120 may include an associated accelerator 135-1, 135-2, and 135-3 (which may be referred to collectively as accelerator 120). Accelerator 135-1 is shown coupled between processor 110 and storage device 120-1; storage device 120-2 is shown coupled between processor 110 and accelerator 135-2; and storage device 120-3 is shown as including accelerator 135-3. While FIG. 3 shows three storage devices 120 and three accelerators 135, embodiments of the disclosure may support any number (one or more) of storage devices 120 and accelerators 135.

FIG. 3 shows processor 110, storage devices 120, and accelerators 135 communicating across bus 305. Bus 305 may be the bus as bus 215 of FIG. 2, or bus 305 may be a different bus than bus 215 of FIG. 2. In addition, while FIG. 3 shows one bus supporting communications between processor 110, storage devices 120, and accelerators 135, embodiments of the disclosure may include any number (one or more) of different buses supporting communication between any of processor 110, storage devices 120, and accelerators 135.

Figure 4:
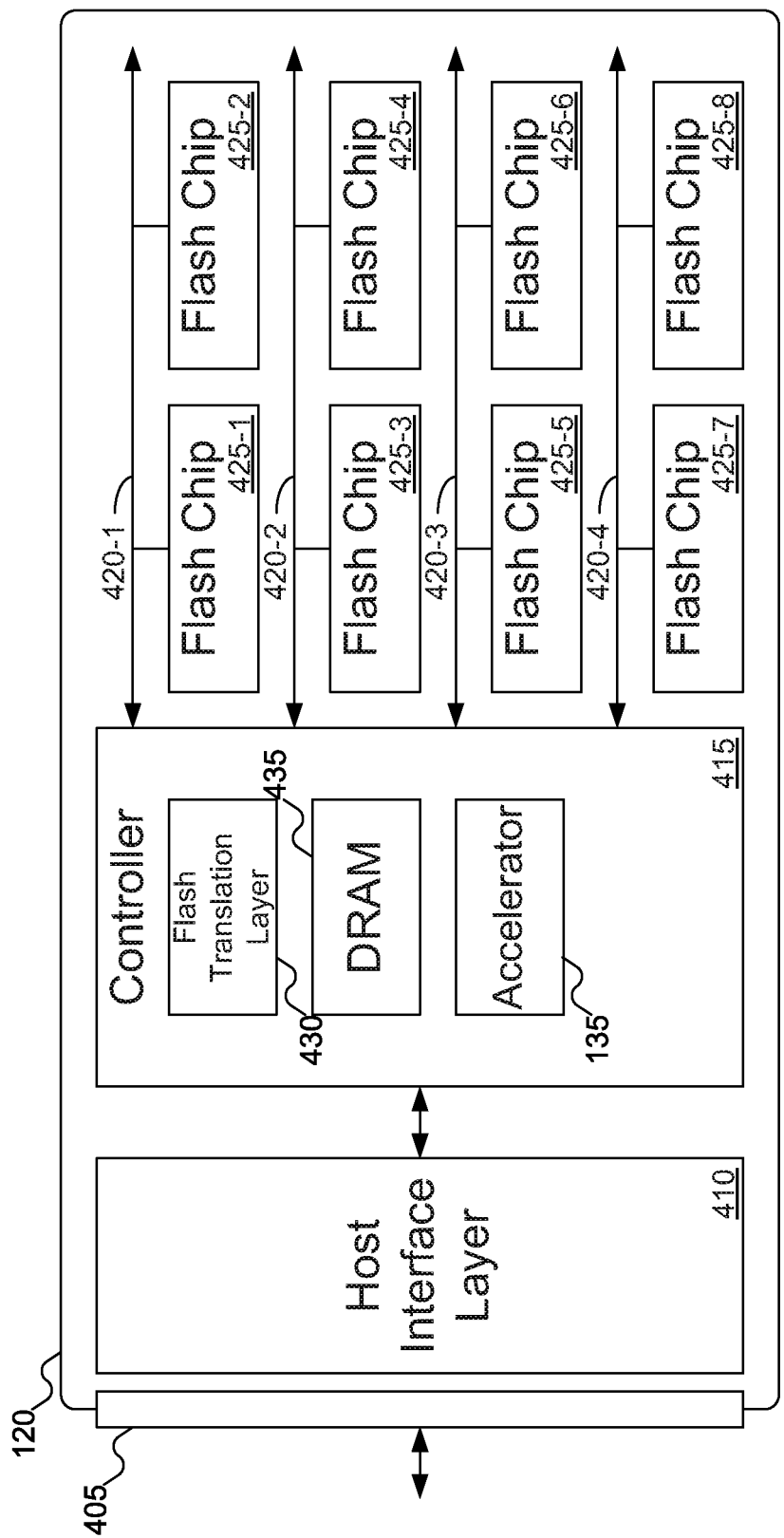
FIG. 4 shows a Solid State Drive (SSD) supporting dictionary decoding, according to embodiments of the disclosure.

FIG. 4 shows a Solid State Drive (SSD) supporting dictionary decoding, according to embodiments of the disclosure. In FIG. 4, SSD 120 may include interface 405. Interface 405 may be an interface used to connect SSD 120 to machine 105 of FIG. 1 (and/or to connect SSD 120 to accelerator 135, when accelerator 135 is not part of SSD 120). SSD 120 may include more than one interface 405: for example, one interface might be used for block-based read and write requests, and another interface might be used for key-value read and write requests. While FIG. 4 suggests that interface 405 is a physical connection between SSD 120 and machine 105 of FIG. 1, interface 405 may also represent protocol differences that may be used across a common physical interface. For example, SSD 120 might be connected to machine 105 using a U.2 or an M.2 connector, but may support block-based requests and key-value requests: handling the different types of requests may be performed by a different interface 405.

SSD 120 may also include host interface layer 410, which may manage interface 405. If SSD 120 includes more than one interface 405, a single host interface layer 410 may manage all interfaces, SSD 120 may include a host interface layer for each interface, or some combination thereof may be used.

SSD 120 may also include SSD controller 415, various channels 420-1, 420-2, 420-3, and 420-4, along which various flash memory chips 425-1, 425-2, 425-3, 425-4, 425-3, 425-6, 425-7, and 425-8 may be arrayed. SSD controller 415 may manage sending read requests and write requests to flash memory chips 425-1 through 425-8 along channels 420-1 through 420-4. Although FIG. 4 shows four channels and eight flash memory chips, embodiments of the disclosure may include any number (one or more, without bound) of channels including any number (one or more, without bound) of flash memory chips.

Within each flash memory chip, the space may be organized into blocks, which may be further subdivided into pages, and which may be grouped into superblocks. The page is typically the smallest unit of data that may be read or written on an SSD. Page sizes may vary as desired: for example, a page may be 4 KB of data. If less than a full page is to be written, the excess space is "unused".

While pages may be written and read, SSDs typically do not permit data to be overwritten: that is, existing data may be not be replaced "in place" with new data. Instead, when data is to be updated, the new data is written to a new page on the SSD, and the original page is invalidated (marked ready for erasure). Thus, SSD pages typically have one of three states: free (ready to be written), valid (containing valid data), and invalid (no longer containing valid data, but not usable until erased) (the exact names for these states may vary).

But while pages may be written and read individually, the block is the basic unit of data that may be erased. That is, pages are not erased individually: all the pages in a block are typically erased at the same time. For example, if a block contains 256 pages, then all 256 pages in a block are erased at the same time. This arrangement may lead to some management issues for the SSD: if a block is selected for erasure that still contains some valid data, that valid data may need to be copied to a free page elsewhere on the SSD before the block may be erased. (In some embodiments of the disclosure, the unit of erasure may differ from the block: for example, it may be a superblock, which may be a set of multiple blocks.)

Because the units at which data is written and data is erased differ (page vs. block), if the SSD waited until a block contained only invalid data, the SSD might actually run out of available storage space, even though the amount of valid data might be less than the advertised capacity of the SSD. To avoid such a situation, SSD controller 415 may include a garbage collection logic (not shown in FIG. 4). The function of the garbage collection may be to identify blocks that contain all or mostly all invalid pages and free up those blocks so that valid data may be written into them again. But if the block selected for garbage collection includes valid data, that valid data will be erased by the garbage collection logic (since the unit of erasure is the block, not the page). So to avoid such data being lost, the garbage collection logic may program the valid data from such blocks into other blocks. Once the data has been programmed into a new block (and the table mapping LBAs to PBAs updated to reflect the new location of the data), the block may then be erased, returning the state of the pages in the block to a free state.

SSDs also have a finite number of times each cell may be written before cells may not be trusted to retain the data correctly. This number is usually measured as a count of the number of program/erase cycles the cells undergo. Typically, the number of program/erase cycles that a cell may support mean that the SSD will remain reliably functional for a reasonable period of time: for personal users, the user may be more likely to replace the SSD due to insufficient storage capacity than because the number of program/erase cycles has been exceeded. But in enterprise environments, where data may be written and erased more frequently, the risk of cells exceeding their program/erase cycle count may be more significant.

To help offset this risk, SSD controller 415 may employ a wear leveling logic (not shown in FIG. 4). Wear leveling may involve selecting data blocks to write data based on the blocks' program/erase cycle counts. By selecting blocks with a lower program/erase cycle count, the SSD may be able to avoid increasing the program/erase cycle count for some blocks beyond their point of reliable operation. By keeping the wear level of each block as close as possible, the SSD may remain reliable for a longer period of time.

SSD controller 415 may include flash translation layer 430 (which may be termed more generally a logical-to-physical translation layer, for storage devices that do not use flash storage) and DRAM 435. Flash translation layer 430 may handle translation of LBAs or other logical IDs (as used by processor 110 of FIG. 1) and physical block addresses (PBAs) or other physical addresses where data is stored in flash chips 425-1 through 425-8. Flash translation layer 430, may also be responsible for relocating data from one PBA to another, as may occur when performing garbage collection and/or wear leveling. DRAM 435 may be local memory used by SSD 120 for any desired purpose. In some embodiments of the disclosure, DRAM 435 may be on the order of 4-64 GB of memory, but may also be larger or smaller than this range of memory.

While FIG. 4 shows SSD 120 as including one accelerator 135, embodiments of the disclosure may include storage device 120 including (or connected to) two or more accelerators 135.

Figure 5:
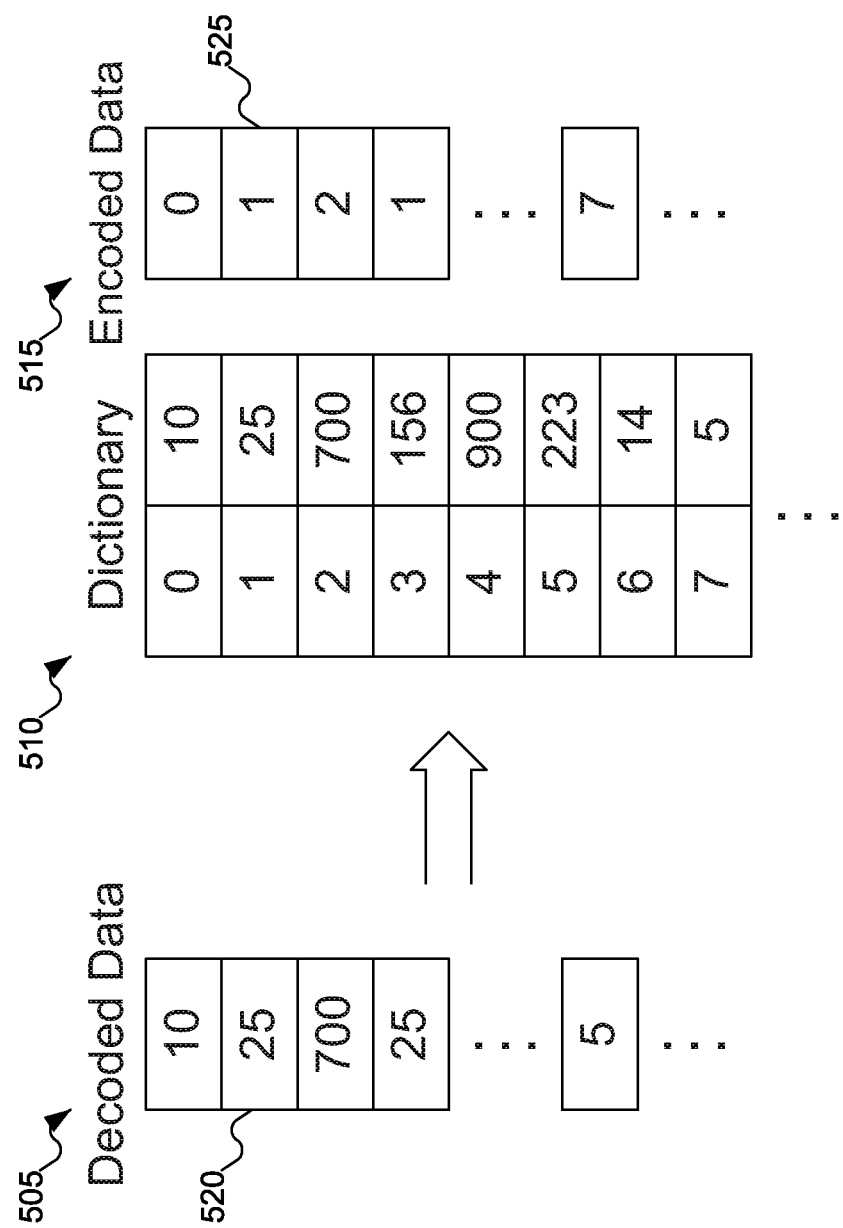
FIG. 5 shows how unencoded/decoded data on the storage device of FIG. 1 may be encoded using a dictionary, according to embodiments of the disclosure.

FIG. 5 shows how unencoded/decoded data on storage device 120 of FIG. 1 may be encoded using a dictionary, according to embodiments of the disclosure. In FIG. 5, decoded (or original) data 505 is shown. While FIG. 5 shows decoded data 505 as a list of integers, embodiments of the disclosure may include any data type: for example, fixed-width data types (that is, data types where the number of bits/bytes used to represent any value in the list is the same). Thus, decoded data 505 may include floating point numbers, unsigned numbers, characters, strings, etc.

A dictionary, such as dictionary 510, may be used to store representations of the decoded data, potentially using fewer bits/bytes than the original data. The premise of dictionary 510 is that while the number of bits/bytes needed to store each value may be significant, the number of unique values to be represented is relatively small. Thus, by establishing a mapping from a "small" unique key to a "large" value and storing only the "small" unique keys may save space.

As an example, consider a database that contains citizenship information. Countries around the world have names whose lengths vary from 4 characters ("Chad") to 56 characters ("The United Kingdom of Great Britain and Northern Ireland"). Assuming one byte is needed per character in a country name, the number of bytes needed to store a country of citizenship as a string could therefore vary from 4 to 56.

On the other hand, there are only roughly 200 countries in the world. The number "200" may be represented using only two signed bytes (or one unsigned byte). So if a dictionary table maps individual keys to the country names, then the keys could be stored in the database rather than the longer country names.

This mapping may save significant space, depending on the number of entries in the database. Continuing the example, assume that the database includes 100,000 entries. To store 100,000 entries, each including 56 bytes (since each entry could, in the worst case, use the longest country name) would require 5,600,000 bytes. In contrast, storing a dictionary table and using two-byte keys in the database would require storing approximately 200×56=11,200 bytes for the dictionary table, and 200,000 bytes in the entries themselves, for a total space requirement of 211,200 bytes: a savings of approximately 96.2% for that portion of the database. Even if the space required to store the full country names in the entries were approximately ½ of the worst case, the space required would still be 2,800,000 bytes, and the dictionary encoding would still save approximately 92.5%.

Thus, FIG. 5 shows an example of the dictionary encoding, using integer values. Given decoded data 505 and dictionary page 510, encoded data 515 may be produced. For example, value 520, which is "25", may be stored in dictionary page 510 as key "1", which may then be stored in encoded data 515 as key 525.

Note that the example values shown in decoded data 505 would all fit in two-byte integers. If two-byte integers are also used for the keys, then there would be no apparent savings of space by using dictionary page 510. But it could be that while all the example values shown in dictionary page 510 would fit in two bytes, there might be other values not shown that could require more than two bytes to store. And even if the width of the keys and values—the number of bits/bytes needed to represent each key and value—are the same, dictionary encoding might still be used.

Dictionary page 510 may be constructed in a number of different ways. One way to construct dictionary page 510 is to scan decoded data 505 one value at a time. If the value is already in dictionary page 510, then the corresponding key may be used in encoded data 515; otherwise, the new value may be added to dictionary page 510 and assigned a new key, which may then be used in encoded data 515. Alternatively, decoded data 515 may be scanned to identify all the unique values. The unique values may then be sorted and assigned keys. Decoded data may then be mapped to encoded data based on the constructed dictionary page 510. Other embodiments of the disclosure may construct dictionary page 510 in other ways.

Figure 6:
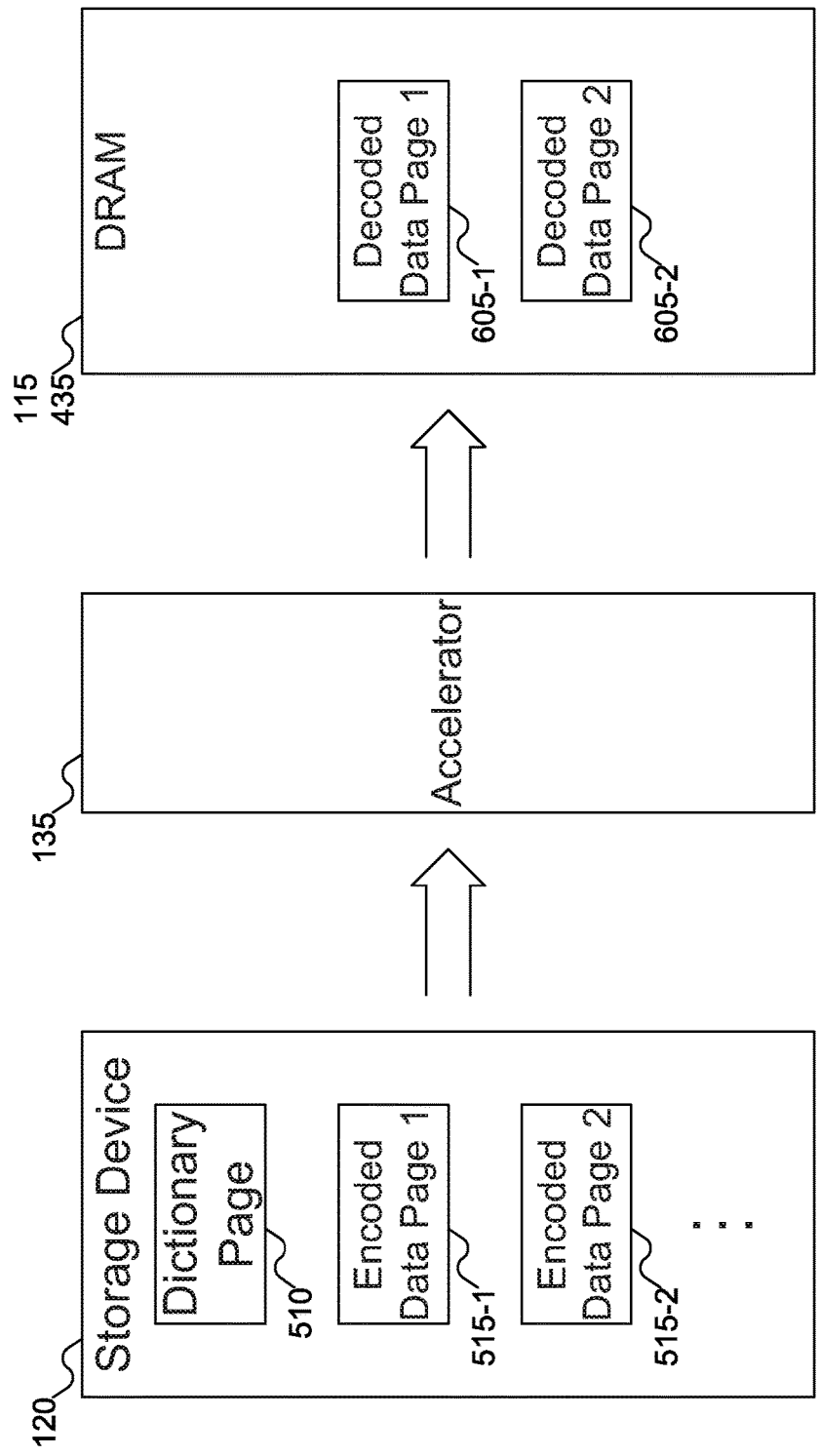
FIG. 6 shows the transfer of decoded data to other storage media of FIGS. 1 and 4, according to embodiments of the disclosure.

FIG. 6 shows the transfer of decoded data to other storage media of FIGS. 1 and 4, according to embodiments of the disclosure. In FIG. 6, storage device 120 is shown as storing dictionary page 510, along with encoded data pages 515-1 and 515-2 (which may be referred to collectively as encoded data page 515). Accelerator 135 may then read dictionary page 510 and encoded data page 515 from storage device 120, decode encoded data page 515, and write decoded data pages 605-1 and 605-2 (which may be referred to collectively as decoded data page 605) to either DRAM 435 (within storage device 120, as shown in FIG. 4) and/or memory 115 (within host 105 of FIG. 1, as shown in FIG. 1), depending on where the data is to be used next. Accelerator 135 may also write decoded data page 605 back to storage device 120, in case decoded data page 605 may be used at some point in the future.

Figure 7:
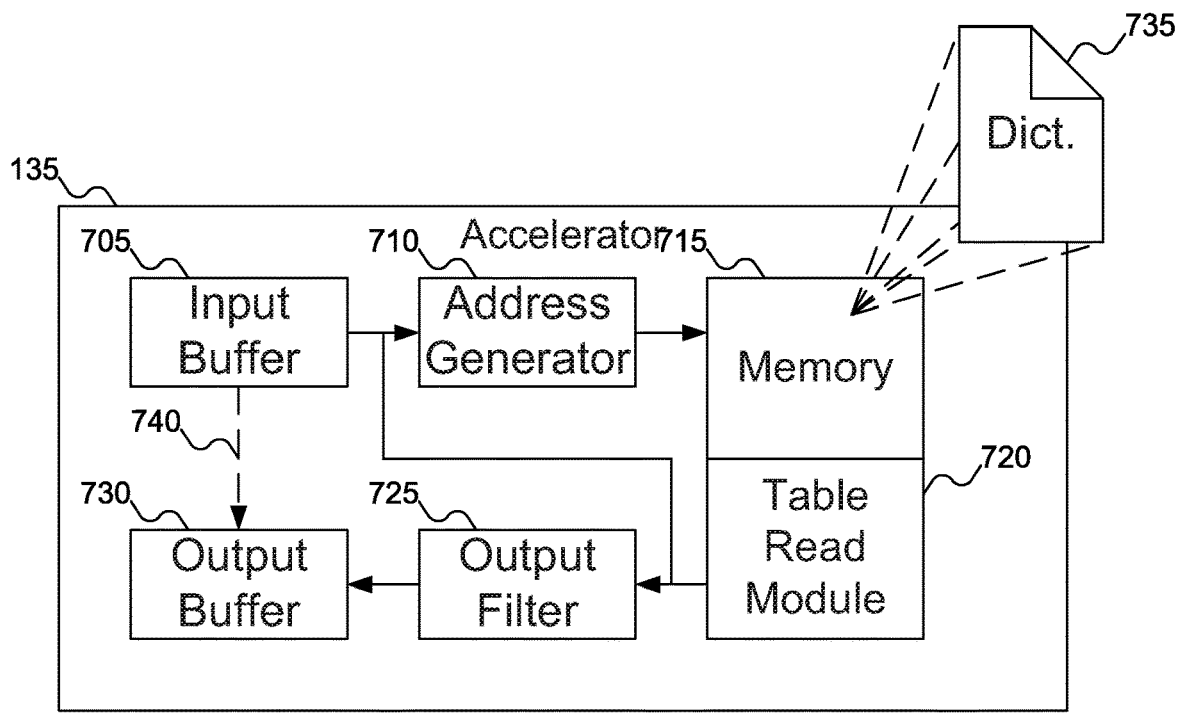
FIG. 7 shows details of the accelerator of FIG. 1, according to embodiments of the disclosure.

FIG. 7 shows details of accelerator 135 of FIG. 1, according to embodiments of the disclosure. In FIG. 7, accelerator 135 is shown as including input buffer 705, address generator 710, memory 715, table read module 720, output filter 725, and output buffer 730. Input buffer 705 may receive data from storage device 120 of FIG. 1, such as encoded data 515 of FIG. 5. Input buffer 705 may receive data from storage device 120 of FIG. 1 via an interface, such as the Advanced Extensible Interface (AXI) over a port on accelerator 135 (not shown in FIG. 7). Input buffer 705 may receive a large block of data to be processed by accelerator 135 at one time, or input buffer 705 may receive data in streams (that is, sent in multiple small chunks rather than as a single large chunk). Input buffer 705 may store the received data temporarily—for example, to fill input buffer 705 before further processing by accelerator 135—or may deliver data for further processing by accelerator 135 as received.

Once the data is received by input buffer 705, address generator 710 may take the key (as stored in encoded data page 515 of FIG. 5) and use that information to generate the address where the value is stored in dictionary table 735. Address generator 710 is discussed further with reference to FIG. 8 below. Dictionary table 735 may store the mapping between key and value (represented by dictionary page 510 of FIG. 5): table read module 720 may then access a data in dictionary table 735 from memory 715, using the address generated by address generator 710, to retrieve the entry/entries (which may also be termed row/rows) from dictionary table 735 that contains the desired value. Table read module 720 may be implemented using, for example, a Central Processing Unit (CPU) or some other processor, a Graphics Processing Unit (GPU), a General Purpose GPU (GPGPU), a Data Processing Unit (DPU), a Tensor Processing Unit (TPU), a Field Programmable Gate Array (FPGA), or an Application-Specific Integrated Circuit (ASIC), among other possibilities. In addition, accelerator 135 may include more than one table read module 720, each of which may be separately implemented using any of the above options. (Accelerator 135 may also include other such processing elements that may be used for other purposes, such as processing the decoded data.) Dictionary table 735 is discussed further with reference to FIGS. 10A-10D below.

Given the entry/entries from dictionary table 735, output filter 725 may then filter out the value to which the key from encoded data page 515 of FIG. 5 is mapped. Output filter is discussed further with reference to FIG. 9 below. This information may be passed to output buffer 730, which may then output decoded data page 605.

Note that accelerator 135 may process the encoded data in encoded data page 515 of FIG. 5. But in some embodiments of the disclosure encoded data page 515 might include more information than just the data encoded using the dictionary 510. For example, consider again a database storing information about the citizenship of some set of people. While the country of citizenship may be data that would benefit from dictionary encoding, the names of the people, or their street addresses might not benefit from dictionary encoding: the number of such unique values is roughly equivalent to the number of entries in the database. Encoded data page 515 of FIG. 5 might include both data that is encoded using dictionary 510 and data that is not dictionary encoded. Since accelerator 135 may perform dictionary decoding of the encoded data, unencoded data may be returned without modification by accelerator 135. Since accelerator 135 may process an entire data page that might include some unencoded data, data from input buffer 705-specifically, data that is not subject to dictionary encoding by accelerator 135—may be provided to output buffer 730, as shown by dashed line 740. Of course, management of data that is not subject to dictionary encoding may be omitted if accelerator 135 only receives the actual data that is subject to dictionary encoding. For example, if a filter external to accelerator 135 identifies what data is subject to dictionary encoding and what data is not subject to dictionary encoding, that external filter might provide just the dictionary-encoded data to accelerator 135, in which case accelerator 135 may simply perform dictionary decoding without concern for data that might be dictionary-encoded.

Memory 715 may be DRAM 435 of FIG. 4 or some equivalent type of memory. But memory 715 may also be an on-chip memory, which may operate faster than DRAM. For example, memory 715 may be block RAM (BRAM) or Ultra RAM (URAM) or some other form of memory. In some embodiments of the disclosure, memory 715 may be on the order of 10-100 MB of memory, but may also be larger or smaller than this range of memory.

While FIG. 7 shows memory 715 as including one dictionary table 735, embodiments of the disclosure may support more than one dictionary table 735 in memory 715. In such embodiments of the disclosure, accelerator 135 may support performing dictionary decoding on data encoded using two or more different dictionaries.

Figure 8:
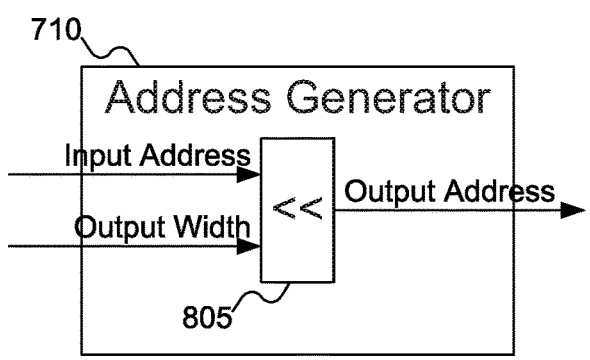
FIG. 8 shows details of the address generator of FIG. 7, according to embodiments of the disclosure.

FIG. 8 shows details of address generator 710 of FIG. 7, according to embodiments of the disclosure. In FIG. 8, accelerator 710 may receive as input the input address (which may be the key) as well as the output width (that is, the number of bits/bytes used to store a single value in the dictionary table). As discussed below with reference to FIGS. 10A-10D, a single entry in dictionary table 735 of FIG. 4 may store one or more different values (or parts of one or more different values). If the output width is fixed for all values in dictionary table 735 of FIG. 7, then given the width of dictionary table 735 of FIG. 7 and the width of a value in dictionary table 735 of FIG. 7, the number of values in each entry in dictionary table 735 may be determined. The least significant bits in the key may then be used to distinguish among the possible values in the entry in dictionary table 735 of FIG. 7: to identify the entry itself, the input value may be shifted to the right by the number of bits needed to distinguish among the values in an entry. Shift module 805 may perform this shift of the input value.

Some examples may help make this clear. Consider the possibility where a single entry in dictionary table 735 of FIG. 7 stores exactly two values: for example, dictionary table 735 of FIG. 7 might be might be eight bytes wide and each value might require four bytes. Since there are two values in each row in dictionary table 735 of FIG. 4, one bit may be used to distinguish between the two values. So shift module 805 may shift the input key to the right by one bit to identify the row in dictionary table 735 of FIG. 7 where the value is desired stored. So, for example, if the input address is the key "6" ("0000 0110" in binary) (actually the seventh value in the table, since addresses may start at zero rather than one), the input address may be shifted by one bit to the right, resulting in the row address "3" ("0000 0011" in binary), as the sixth value may be found in row three of dictionary table 735.

On the other hand, consider the situation where a single entry in dictionary table 735 of FIG. 7 stores exactly four entries: for example, dictionary table 735 of FIG. 7 might be eight bytes wide and each value might require two bytes. Since there are four values in each row in dictionary table 735 of FIG. 7, two bits may be used to distinguish among the four values. So shift module 805 may shift the input key to the right by two bits to identify the row in dictionary table 735 where the desired value is stored. So, for example, if the input address is the key "6" ("0000 0110; in binary), the input address may be shifted by two bits to the right, resulting in the address "1" ("0000 0001" in binary), as the sixth value may be found in row one of dictionary table 735.

Figure 9:
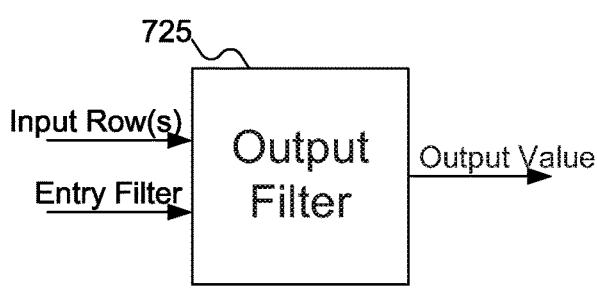
FIG. 9 shows details of the output filter of FIG. 7, according to embodiments of the disclosure.

FIG. 9 shows details of output filter 725 of FIG. 7, according to embodiments of the disclosure. In FIG. 9, given as input a row (or rows) from dictionary table 735 of FIG. 7 and the least significant bits of the input address (labeled "entry filter" in FIG. 9), output filter 725 may use the entry filter to distinguish among values in the row to filter out the desired value. This filtering may be accomplished by masking and shifting the value to eliminate any bits/bytes that are not part of the desired value. For example, bits/bytes that are to the left of the desired value may be masked, and bits/bytes to the right of the desired value may be removed by shifting the desired value to the right.

Consider again the example where a row in dictionary table 735 of FIG. 7 includes eight bytes, and each value is four bytes wide. Since there are two values in each row in dictionary table 735 of FIG. 7, one bit may be used to distinguish between the two values. If the entry filter is zero, then the first four bytes in the row in the entry may be masked to zero; otherwise, the entry may be shifted to the right by four bytes.

On the other hand, consider again the example where a row in dictionary table 735 of FIG. 36 includes eight bytes, and each value is two bytes wide. Since there are our values in each row in dictionary table 735 of FIG. 7, two bits may be used to distinguish between the four values. Based on the entry filter, two of the eight bytes in the row may be left after masking/shifting is complete.

Figures 10A, 10B, 10C:
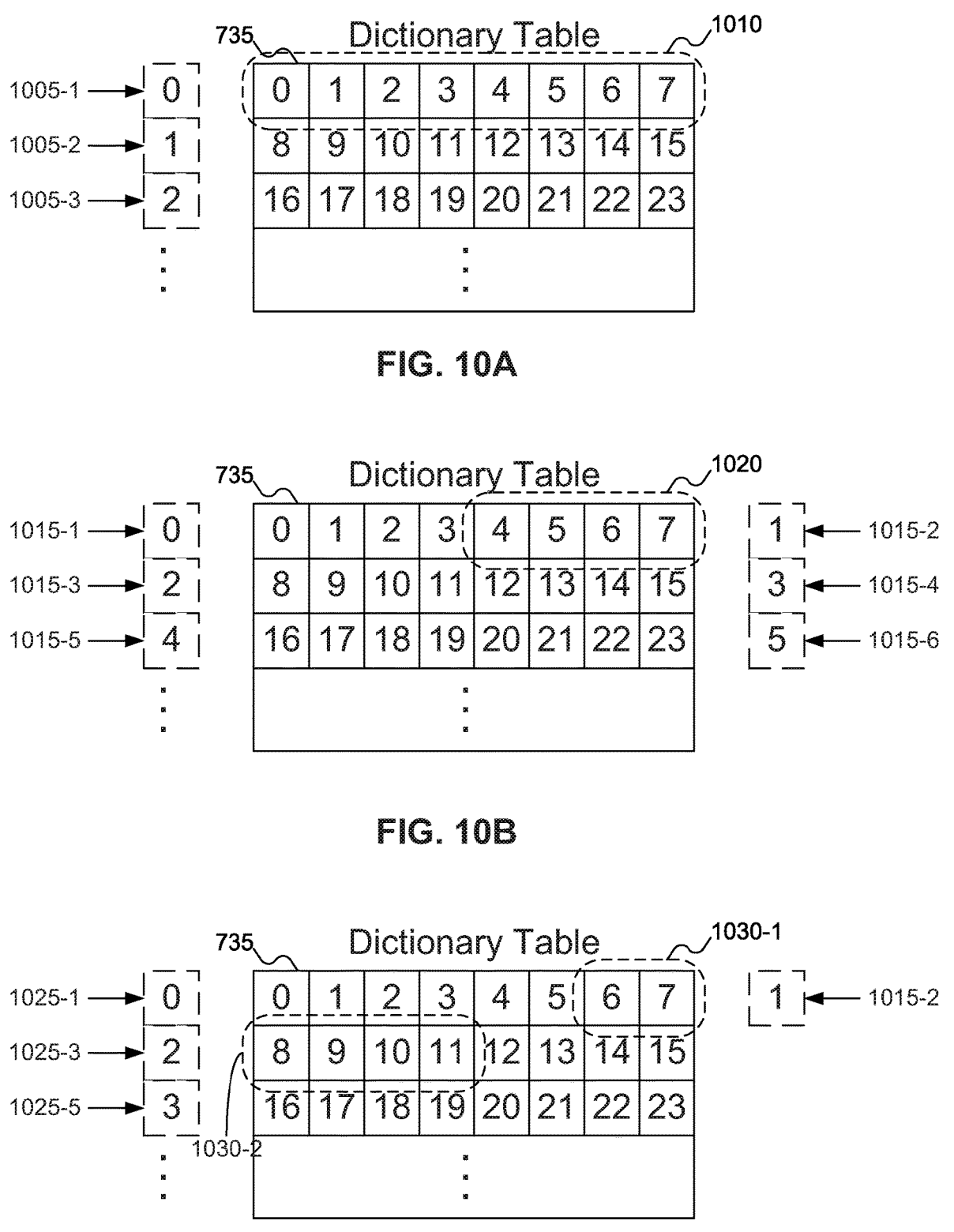
Figure 10D:
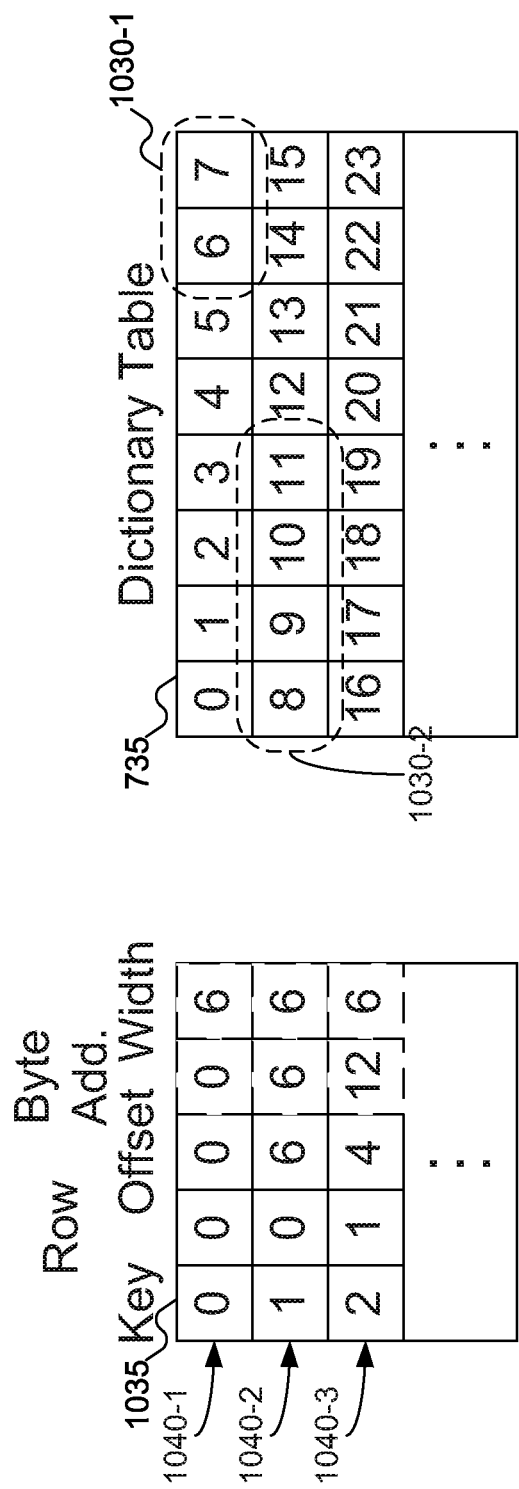
FIG. 10D shows a fourth way data may be stored in and retrieved from the dictionary table of FIG. 7, according to embodiments of the disclosure.

In the above examples, the value may be found entirely within a single row of dictionary table 735 of FIG. 7, as the width of dictionary table 735 of FIG. 7 is a multiple of the width of the decoded data. In some embodiments of the disclosure, this relationship may not be true, and a single decoded value may be split across two rows in dictionary table 735 of FIG. 7. FIGS. 10C-10D below discuss how this situation may be handled.

Given the above discussion, it should be apparent that accelerator 135 of FIG. 1 may support dictionary decoding. But more than just supporting dictionary decoding, accelerator 135 of FIG. 1 may support dictionary decoding with any size dictionary table 735 of FIG. 7, and encoded data width, and any decoded data width. Rather than being customized specific for a dictionary, accelerator 135 of FIG. 1 may be used with any dictionary with a fixed decoded data width. Thus, accelerator 135 may be used at one time using a dictionary with one encoded data width, and at another time with a dictionary with another encoded data width, without requiring any reconfiguring (beyond storing the new dictionary in dictionary table 735 and specifying the encoded and decoded data widths to be used).

In the above discussion, accelerator 135 of FIG. 1 has been described as though using byte-aligned data types. Since this is true for many data types, byte alignment is convenient to use. But embodiments of the disclosure may use data widths that are measured in bits rather than bytes: for example, if data is packed. Data may be packed if the normal width of the data is greater than needed. For example, two bytes may be used to store (signed) integers up to 32767. But if the values are limited to between 0 and 15, then only four bits are needed to represent the possible values. By packing four four-bit numbers into two bytes, the data may be stored more compactly, albeit by no longer being byte-aligned. Accelerator 135 of FIG. 1 may handle such packed data simply by measuring widths in terms of bits rather than bytes. For example, in an eight-byte wide row of dictionary table 735 of FIG. 7, 16 different four-bit values may be stored. If the provided key is the value 1 (that is, the second entry), then the output filter may filter out all but the second quartet of bits from the row. (Of course, dictionary encoding may not be of much value in the described example, as the encoded width might be larger than the decoded width, but the principle stands).

FIGS. 10A-10D show different ways data may be stored in and retrieved from dictionary table 735 of FIG. 7, according to embodiments of the disclosure. In FIG. 10A, dictionary table 735 is shown as eight bytes wide, and storing eight byte data. The first row of dictionary table 735 may store value 1005-1, the second row of dictionary table 735 may store value 1005-2, the third row of dictionary table 735 may store value 1005-3, and so on (values 1005-1 through 1005-3 may be referred to collectively as values 1005). Thus, the input key may be used as the row identifier in dictionary table 735 without modification (or, more accurately, by having shift module 805 of FIG. 8 shift the input key to the right by zero bits). For example, if the input key is "0", then the first row of dictionary table 735 may store the value, including bytes zero through sever, as shown by dashed area 1010.

In FIG. 10B, dictionary table 735 is shown as eight bytes wide, and storing four byte data. The first row of dictionary table 735 may store values 1015-1 and 1015-2, the second row of dictionary table 735 may store values 1015-3 and 1015-4, the third row of dictionary table 735 may store values 1015-5 and 1015-6, and so on (values 1015-1 through 1015-6 may be referred to collectively as values 1015). Thus, the input key may be used as the row identifier in dictionary table 735 by shifting the input key by one bit to the right (since one bit is enough to distinguish between two different values in the row). For example, if the input key is "1", then the first row of dictionary table 735 may store the value (as "1" in binary is "0000 0001", and after shifting "1" to the right one bit, the result is "0000 0000", indicating the first row in dictionary table 735), including bytes four through seven, as shown by dashed area 1020.

In FIG. 10C, dictionary table 735 is shown as eight bytes wide, and storing six byte data. The first row of dictionary table 735 may store values 1025-1 and the start of value 1025-2, the second row of dictionary table 735 may store the conclusion of value 1025-2 and the start of value 1025-3, the third row of dictionary table 735 may store the conclusion of value 1025-3 and value 1025-4, and so on (values 1025-1 through 1025-4 may be referred to collectively as values 1025). Thus, the input key might be used as the row identifier in dictionary table 735 by shifting the input key by one bit to the right (since one bit is enough to distinguish between two different values in the row), subject to the caveat discussed below. For example, if the input key is "1", then the first row of dictionary table 735 may store the value (as "1" in binary is "0000 0001", and after shifting "1" to the right one bit, the result is "0000 0000", indicating the first row in dictionary table 735), including bytes six through seven, as shown by dashed area 1030-1; since the first row only includes two bytes of the value, the remaining four bytes may be found in the second row, as shown by dashed area 1030-2.

When a single row will hold some number of values precisely, the above description works as described. But when a single entry may span multiple rows due to the width of dictionary table 735 not being an exact multiple of the width of the decoded data, then some modifications may be needed. First, because a value may span multiple rows, accelerator 135 of FIG. 1 may retrieve two rows from dictionary table 735 to locate the value. Accelerator 135 of FIG. 1 may be modified to retrieve the identified row and the following row in each case: at worst, the data in the second row may be discarded by output filter 725 of FIG. 7.

Second, and more importantly, eventually just shifting the key by some number of bits may return an incorrect row identifier. For example, key "4" (the fifth value) would be represented in binary as "0000 0100". With two values in each row, one bit may be used to distinguish between the values: shifting "0000 0100" by one bit to the right would return "0000 0010", suggesting that the value may be found in row 2 (the third row in dictionary table 735). But in fact the fifth value would be found in bytes zero through five of the fourth row of dictionary table 735. This error occurs because eventually some value will end in the last byte of a row in dictionary table 735 (which may occur when the number of bytes needed to store a multiple of the values also is a multiple of the width of dictionary table 735).

There are a few different ways in which this problem may be addressed. One solution is to use a more complicated formula to calculate the row in which the desired value may be located than just a shift operation. If the dictionary width is represented as $w_{dict}$, the decoded data width is represented as $w_{data}$, and the key is represented as k, then the row in which the desired value starts may be calculated as $$\lfloor \frac{k \times w_{data}}{w_{dict}} \rfloor.$$

Continuing the earlier example, using k=4, $w_{data}$=6, and $w_{dict}$=8, the row including the fifth value is $$\lfloor \frac{4 \times 6}{8} \rfloor = \lfloor \frac{24}{8} \rfloor = 3,$$

which is the correct row number (again remembering that rows in dictionary table 735 may start at zero). This calculation works because, if the bytes in dictionary table 735 are numbered consecutively starting at zero, then k×$w_{data}$ is the byte in dictionary table 735 where the desired value starts; dividing by the width of dictionary table 735 and taking the floor of that result (or alternatively, discarding any remainder) identifies the row in which that byte is located.

Another solution to the problem may be used as shown in FIG. 10D. In FIG. 10D, rather than calculating the row in which a desired value is stored using the key, the decoded data width, and the width of dictionary table 735, accelerator 135 of FIG. 1 may store (for example, in memory 715 of FIG. 7) table 1035, which may map a particular key to a particular row and offset where the data is stored. Thus, for example, entry 1040-1 shows that key "0" is stored in dictionary table 735 starting at row zero, offset zero, entry 1040-2 shows that key "1" is stored in dictionary table 735 starting at row zero, offset six, entry 1040-3 shows that key "2" is stored in dictionary table 735 starting at row one, offset four, and so on. Then, given a particular key, a lookup in table 1035 may identify the row and offset in dictionary table 740 where that value is stored: the identified row (and perhaps the next row, if a value is split across two rows) may be retrieved, and the output filter may then reduce that information to just the desired value as described above.

In addition to or alternatively to storing the row and offset of each key, table 1035 may store the byte address and/or the width of the data (shown as optional information by dashed boxes in FIG. 10D). The byte address may be used to determine the row and offset where the desired value starts in dictionary table 735, similar to the discussion above regarding determining the row and offset from a key. Where the data is of fixed width (that is, all values in dictionary table are the same width) and this value is known by accelerator 135 of FIG. 1, the width of each individual data element does not need to be stored in table 1035. Even for variable width data, the width of any individual value may be determined by determining the number of bits/bytes between adjacent keys in table 1035 (that is, by counting the number of bits/bytes between where one value starts in dictionary table 740 and where the next value starts in dictionary table 740). But by storing the width of values in table 1035, accelerator 135 may be extract the width of a value along with its location, avoiding the need to calculate the width of the value in decoding the key.

Note that storing the individual lengths for each data value also provides an alternative way to locate a value in dictionary table 740: accelerator 135 of FIG. 1 may calculate a running sum of the widths of the individual values: that sum, divided by the width of dictionary table 735, identifies the row where the value starts, with the remainder identifying the offset within the row. In such an embodiment of the disclosure, table 1035 may store only the widths of the individual values, rather than their rows/offsets.

Table 1035 may also offer other benefits. First, by supporting the possibility that the data width of entries in dictionary table 735 might not be fixed, table 1035 enables storing variable-width data in dictionary table 735. In addition, table 1035 may support storing values that may exceed the width of dictionary table 740. By using table 1035 to identify where individual values are located in dictionary table 740, there does not need to be a relationship between the key and where the value is stored in dictionary table 740. Thus, while using address generator 710 permits a simple calculation of the row in which a value is located, using table 1035 may provide for a more general solution.

Table 1035 may be constructed in advance (for example, when dictionary table 735 is loaded into accelerator 135 of FIG. 1), since all that is needed is to know the number of values (that is, the different keys that may be used), the width of the decoded data, and the width of dictionary table 740: the rest is simple arithmetic. In fact, the number of different values does not even need to be known, since the worst case may be assumed (which would be equal to the number of rows in dictionary table 735, multiplied by the width of dictionary table 735, divided by the width of the decoded data (or the width of the narrowest decoded data, if variable-width data is stored in dictionary table 735). And if the key used is identical to the row number in table 1035, then table 1035 does not need to store the key either.

In addition, by storing the starting bit/byte of each value in dictionary table 740, table 1035 may permit accelerator 135 of FIG. 1 to store variable width data types. For example, as discussed above, country names, when used as strings, may vary in width from four bytes to 56 bytes. All the string names may be made the same width by padding the individual values appropriately (with either spaces or null characters, for example) to be as long as the longest string, in which case accelerator 135 of FIG. 1 may be used as described above. But by storing the row and offset where each value starts, accelerator 135 of FIG. 1 may determine not only the starting location of the value in dictionary table 740, but also its width by comparing the row and offset for adjacent keys in table 1035. When variable width data types are used, table 1035 may require scanning dictionary page 510 of FIG. 5 to determine the width of each value (which may affect the row and offset of other values in table 1035).

Figure 11:
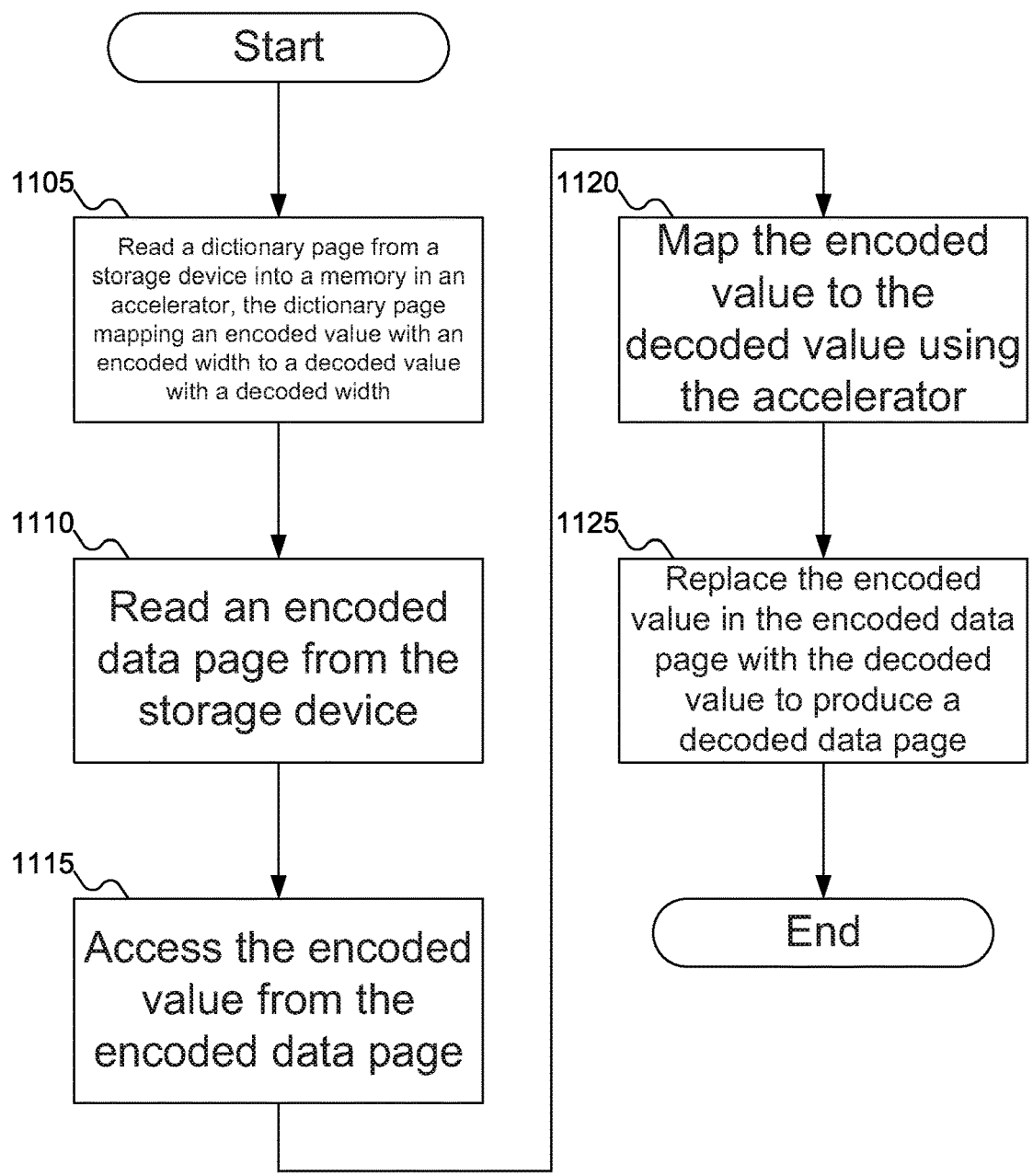
FIG. 11 shows a flowchart of an example procedure for using the accelerator of FIG. 1 to perform dictionary decoding in support of data stored on the storage device of FIG. 1, according to embodiments of the disclosure.

FIG. 11 shows a flowchart of an example procedure for using the accelerator of FIG. 1 to perform dictionary decoding in support of data stored on the storage device of FIG. 1, according to embodiments of the disclosure. In FIG. 11, at block 1105, accelerator 135 of FIG. 1 may read dictionary page 510 of FIG. 5 from storage device 120 of FIG. 1. Accelerator 135 of FIG. 1 may also configure itself to access data appropriately from dictionary table 735 of FIG. 7 after reading dictionary page 510 of FIG. 5 into dictionary table 735 of FIG. 7. At block 1110, accelerator 135 of FIG. 1 may read encoded data page 515 of FIG. 5 (or alternatively, data from encoded data page 515 of FIG. 5 may be fed to accelerator 135 of FIG. 1).

At block 1115, accelerator 135 of FIG. 1 may access an encoded value in encoded data page 515 of FIG. 5. At block 1120, accelerator 135 of FIG. 1 may map the encoded value from encoded data page 515 of FIG. 5 to a desired value in dictionary table 735 of FIG. 7. Finally, at block 1125, accelerator 135 of FIG. 1 may replace the encoded value in encoded data page 515 of FIG. 5 with the desired value from dictionary table 735 of FIG. 7, producing decoded data page 605 of FIG. 6. Blocks 1110 through 1125 may be repeated as often as necessary, depending on the number of encoded values in encoded data page 515 of FIG. 5.

Figure 12A:
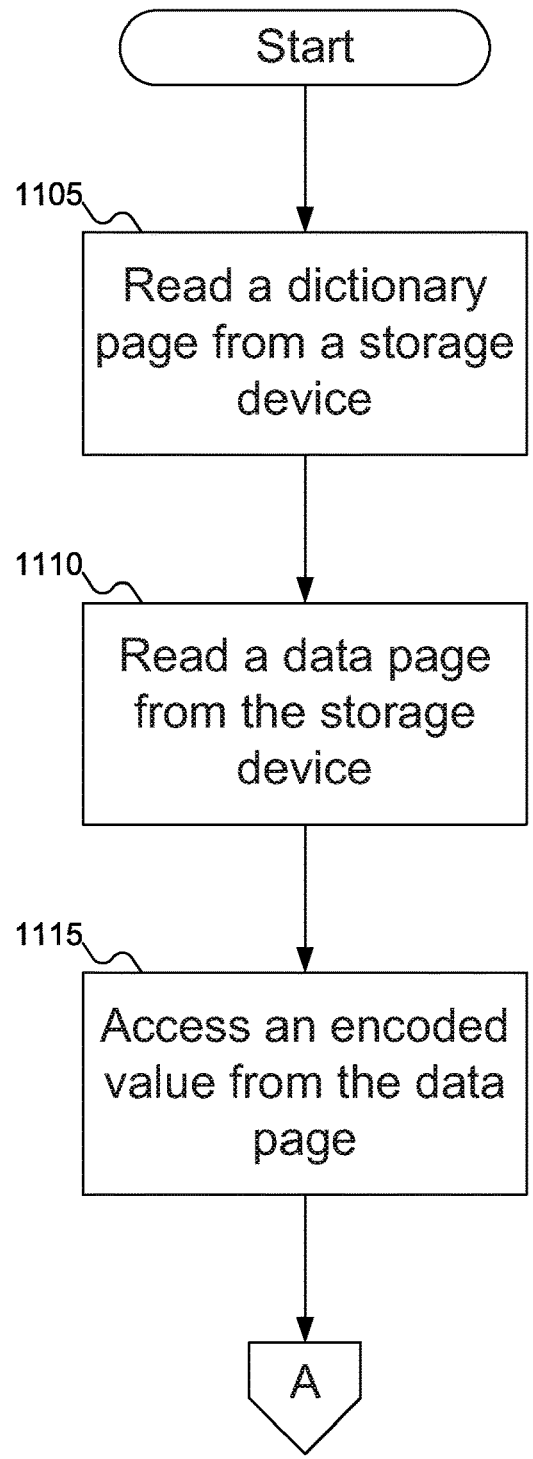
FIG. 12A show a flowchart of another example procedure for using the accelerator of FIG. 1 to perform dictionary decoding in support of data stored on the storage device of FIG. 1, according to embodiments of the disclosure.
Figure 12B:
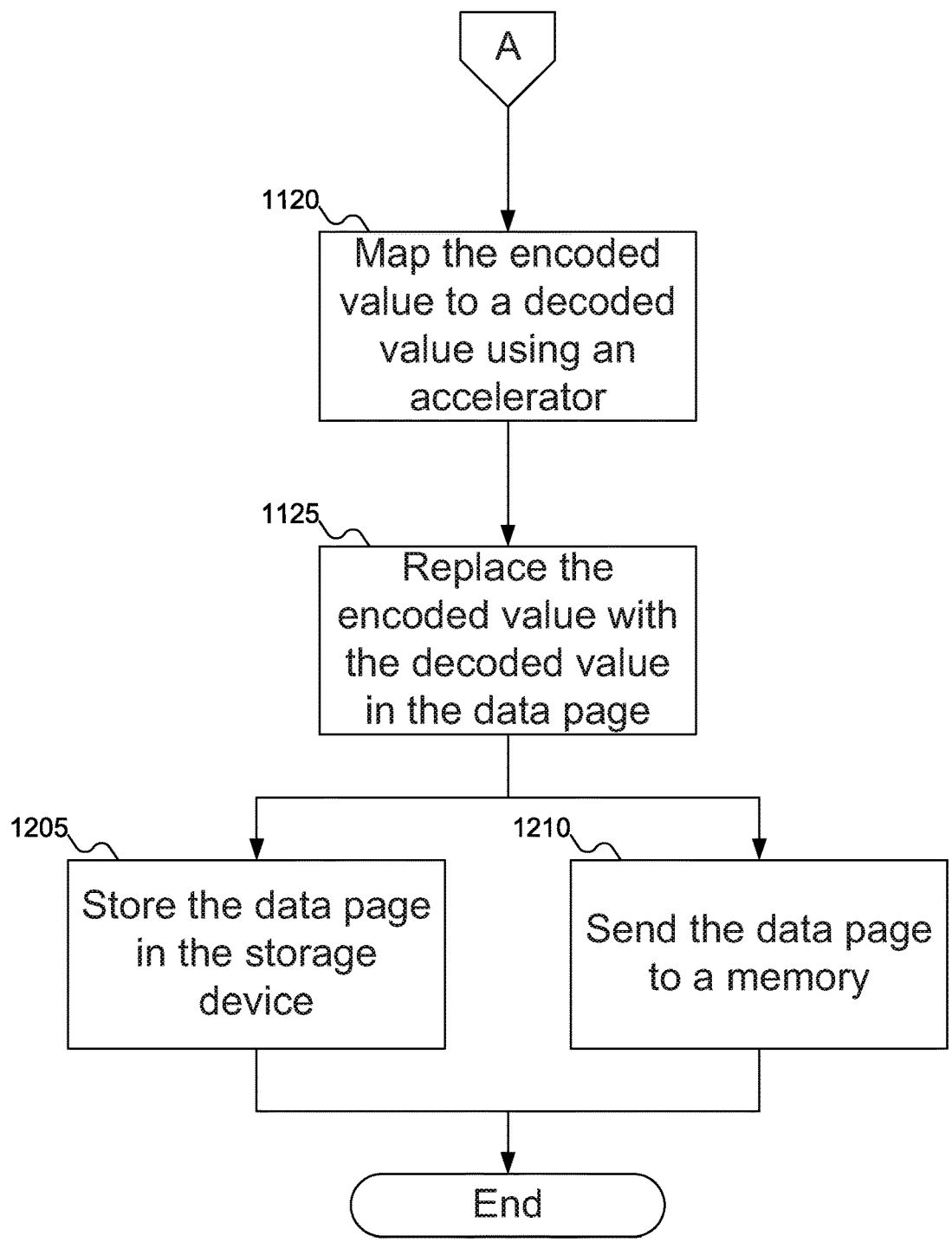
FIG. 12B continues the flowchart of FIG. 12A of another example procedure for using the accelerator of FIG. 1 to perform dictionary decoding in support of data stored on the storage device of FIG. 1, according to embodiments of the disclosure.

FIGS. 12A-12B show a flowchart of another example procedure for using accelerator 135 of FIG. 1 to perform dictionary decoding in support of data stored on storage device 120 of FIG. 1, according to embodiments of the disclosure. FIGS. 12A-12B are similar to FIG. 11, but more general and with some additional blocks. In FIG. 12A, at block 1105, accelerator 135 of FIG. 1 may read dictionary page 510 of FIG. 5 from storage device 120 of FIG. 1. Accelerator 135 of FIG. 1 may also configure itself to access data appropriately from dictionary table 735 of FIG. 7 after reading dictionary page 510 of FIG. 5 into dictionary table 735 of FIG. 7. At block 1110, accelerator 135 of FIG. 1 may read encoded data page 515 of FIG. 5 (or alternatively, data from encoded data page 515 of FIG. 5 may be fed to accelerator 135 of FIG. 1). At block 1115, accelerator 135 of FIG. 1 may access an encoded value in encoded data page 515 of FIG. 5.

At block 1120 (FIG. 12B), accelerator 135 of FIG. 1 may map the encoded value from encoded data page 515 of FIG. 5 to a desired value in dictionary table 735 of FIG. 7. At block 1125, accelerator 135 of FIG. 1 may replace the encoded value in encoded data page 515 of FIG. 5 with the desired value from dictionary table 735 of FIG. 7, producing decoded data page 605 of FIG. 6. Blocks 1110 through 1125 may be repeated as often as necessary, depending on the number of encoded values in encoded data page 515 of FIG. 5. Finally, there are two possible steps: accelerator 135 of FIG. 1 may store decoded data page 605 of FIG. 6 back to storage device 120 of FIG. 6 (as shown in block 1205), or accelerator 135 of FIG. 1 may send decoded data page 605 of FIG. 6 to DRAM 435 of FIG. 4 or memory 115 of FIG. 1 (as shown in block 1210).

Figure 13:
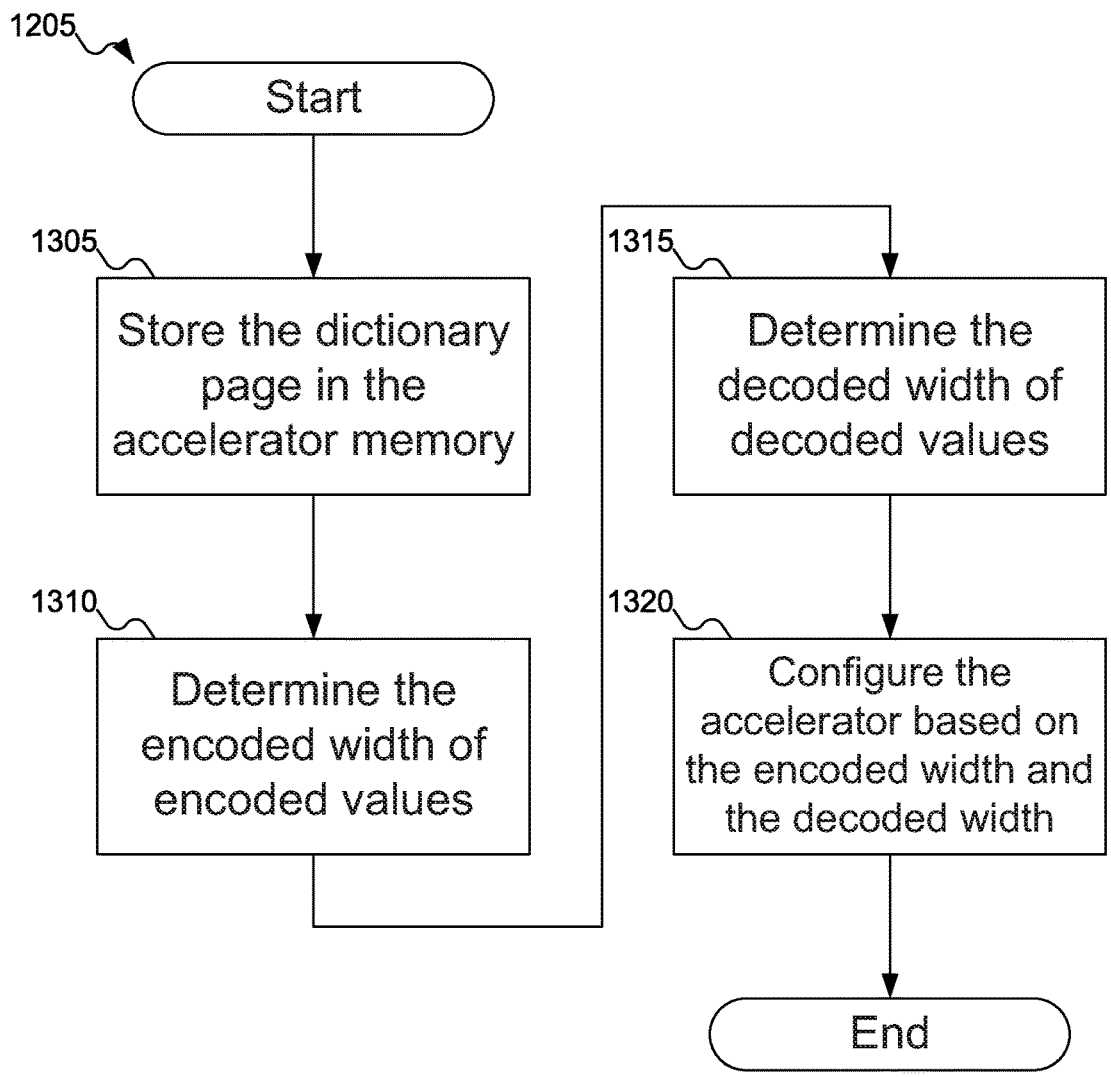
FIG. 13 shows a flowchart of an example procedure to load the dictionary page of FIG. 5 into the accelerator of FIG. 1 and to configure the accelerator of FIG. 1, according to embodiments of the disclosure.

FIG. 13 shows a flowchart of an example procedure to load dictionary page 510 of FIG. 5 into accelerator 135 of FIG. 1 and to configure accelerator 135 of FIG. 1, according to embodiments of the disclosure. In FIG. 13, at block 1305, accelerator 135 of FIG. 1 may store dictionary page 510 of FIG. 5 into dictionary table 735 of FIG. 7. At block 1310, accelerator 135 of FIG. 1 may determine the width of the encoded values as used in dictionary page 510 of FIG. 5 (which may be determined, for example, by the number of bits/bytes used to store the largest key in dictionary page 510 of FIG. 5). At block 1315, accelerator 135 of FIG. 1 may determine the width of the decoded values used in dictionary page 510 of FIG. 5 (which may be determined, for example, by the number of bits/bytes used to store values in dictionary page 510 of FIG. 5.) Finally, at block 1320, accelerator 135 of FIG. 1 may configure itself using the width of the encoded data and the width of the decoded data.

Figure 14:
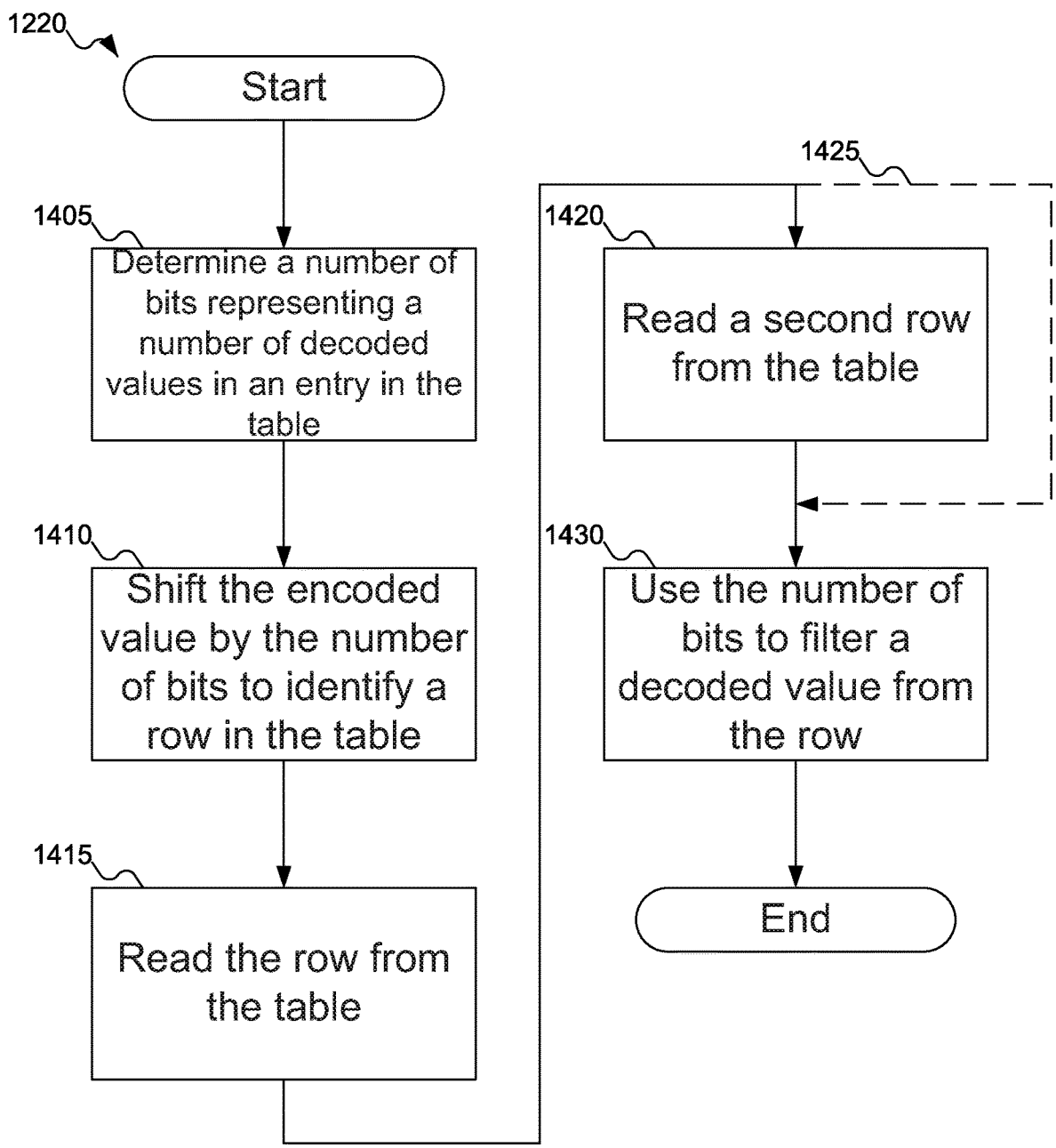
FIG. 14 shows a flowchart of an example procedure for the accelerator of FIG. 1 to map an encoded value to a decoded value using the dictionary table of FIG. 7, according to embodiments of the disclosure.

FIG. 14 shows a flowchart of an example procedure for accelerator 135 of FIG. 1 to map an encoded value to a decoded value using dictionary table 735 of FIG. 7, according to embodiments of the disclosure. In FIG. 14, at block 1405, accelerator 135 of FIG. 1 may determine the number of bits used to distinguish among values in a single row of dictionary table 735 of FIG. 7. At block 1410, address generator 710 of FIG. 7 may shift the encoded value (the key) by the number of bits used to distinguish among values in a single row of dictionary table 735 of FIG. 7, to produce a row identifier. At block 1415, accelerator 135 of FIG. 1 may read the identified row from dictionary table 735 of FIG. 7. At block 1420, accelerator 135 of FIG. 1 may also read the adjacent row in dictionary table 735, which may be used if a decoded value is split across two rows in dictionary table 735. Block 1420 may be omitted, As shown by dashed line 1425, if the desired value may be found within a single row in dictionary table 735 of FIG. 7. Finally, at block 1430, output filter 725 of FIG. 7 may filter the desired value from the row(s) of dictionary table 735 of FIG. 7, based on the bits used to distinguish among values in a row of dictionary table 735 of FIG. 7.

In FIGS. 12A-14, some embodiments of the disclosure are shown. But a person skilled in the art will recognize that other embodiments of the disclosure are also possible, by changing the order of the blocks, by omitting blocks, or by including links not shown in the drawings. All such variations of the flowcharts are considered to be embodiments of the disclosure, whether expressly described or not.

As the size of data generated every day increases, there may be a computational bottleneck in the storage devices. The interface between the storage device and the computational platform may be a limitation due to limited bandwidth that might not scale as the number of storage devices increases. Interconnect networks may not provide simultaneous accesses to all storage devices and thus may limit the performance of the system when independent operations occur on different storage devices.

Offloading computations to the storage devices may reduce or eliminate the burden of data transfer from the interconnects. Near storage computing may offload a portion of computation to the storage devices to accelerate the big data applications. A near storage accelerator for database sort (or other database operations) may utilize a computational storage device, such as a Non-Volatile Memory Express (NVMe) flash drive with an on-board Field Programmable Gate Array (FPGA) chip (or other processor) that processes data in-situ. The near storage accelerator may support dictionary decoding, sort, and shuffle operations. The near storage accelerator may support sorting columns with any arbitrary data type, while considering the specifications of the storage devices to increase the scalability of computer systems as the number of storage devices increases. The system may improve both performance and energy efficiency as the number of storage devices increases.

With the growth of data, processing large amounts of data has become a cornerstone of many big data use-cases, such as database applications. As the size of the stored data increases, the cost of loading and storing the data may outweigh the computation cost, which may reduce performance. In some applications, such as database, graph processing, machine learning, and statistical analysis, more than half of the execution time may be spent on data transfer, which shows the impact of data communication on overall performance. The rapid development of Solid-State Drives (SSDs) has shifted the bottleneck associated with data transfer time from magnetic disks (i.e., seek and rotational latency) to interconnect bandwidth and operating system overhead.

The Peripheral Component Interconnect Express (PCIe) interface provides limited simultaneous accesses to the storage devices, which may limit the scalability of the system when independent operations are called on in different storage devices in parallel. This issue, along with low performance of the interconnect bus, may increase the gap between the performance capacity of storage devices and the interconnection buses.

Near-storage computing may enable offloading a portion of computation to the storage drive to accelerate big data applications. Accordingly, new devices have been developed to bring the computation power into the flash storage devices. A computational storage device may be, for example, an NVMe flash drive with an on-board FPGA chip that processes data in-situ. The FPGA, as the computation node of the computational storage device, may provide a high degree of parallelism with affordable power consumption and reconfigurability to implement versatile applications. FPGAs may run parallelizable applications faster with less power as compared to general-processing cores (i.e., a host processor). The benefits achieved by using a computational storage device over a conventional storage device may include both increasing the overall performance by offloading tasks to near-storage nodes to bridge the interconnection gap reduced power consumption through the use of the FPGA. Since the performance of data-intensive applications, such as database management, may be limited by the system bandwidth, such applications may be accelerated by offloading the computations to the storage drive. Therefore, recent processing systems aim to offload the query processing to storage drive to minimize data transfer between the host and storage. In addition, unlike compute-intensive applications, input/output (I/O) bound applications may not benefit from high-performance host processors as their performance may be limited by the host-to-storage bandwidth. Therefore, offloading I/O bound applications to computational storage devices release the host resources to execute more compute-intensive tasks.

As the size of the real-world databases grows, storing databases may involve multiple storage devices. Database-management systems may partition databases into multiple partitions and breakdown operations into multiple independent operations on the partitioned database. Although the independent operations may be executed in parallel, due to storage-to-host bandwidth limitation in I/O bound applications, host processors may not fully utilize the partitioning opportunity. But as computational storage devices have their own computation resources, a computational storage device may perform the independent operations in-situ without using the storage-to-host bandwidth. In particular, a sort operation may be commonly used in database-query processing as a standalone operation or as a backbone of more complex database operations, such as merge-join, distinct, order-by, group-by, etc. When sorting a database, all the table columns may be sorted based on a single column, dubbed a key column. FPGA-based accelerators may focus on accelerating numeric arrays, due to the high complexity of sorting string arrays. However, sorting a table based on a non-numeric column may be widely used in database systems. Due to the number of columns, real-world databases may be complicated to sort because after sorting the key column, the rest of the table should be shuffled accordingly.

Database management systems may use data encoding to compress the stored data into the storage devices. Dictionary encoding may be a lossless one-to-one compression method that replaces attributes from a large domain with small numbers. To sort the database, if the data is stored in the encoded format, the table should be decoded and then sorted.

Computational storage devices may offer independent operations on data stored in each storage device. To sort database tables, a near-storage sort may use computational storage devices that comprise FPGA-based accelerators with specific kernels to accelerate dictionary decoding, sort, and the subsequent shuffle operations. The system may support sorting columns with any arbitrary data types. If the table is stored in the encoded format, the dictionary-decoding kernel may decode the key column. Then, the sort kernel may sort the key column, and the shuffle kernel may reorder the table according to the sorted key column. Such a system not only inherently addresses the data transfer issue by carrying out computations near the storage system, but also embraces an FPGA-friendly implementation of dictionary decoding, sort, and shuffle operations. Additionally, if data is stored in dictionary-encoded format, the system may utilize dictionary encoded data to sort other data types than integer and long data types. Dictionary-encoding may map different data types to integer key values, and the system may first sort the encoded data and then—by using a novel dictionary-decoder kernel that supports any arbitrary data types—decode the sorted column to the original data type.

Embodiments of the disclosure may include accelerator 135 of FIG. 1 as a near-storage accelerator that brings computations closer to the storage devices by leveraging a computational storage device.

Embodiments of the disclosure may include accelerator 135 of FIG. 1 with an FPGA-friendly architecture (or some other substitutable architecture) for a bitonic sort that benefits from FPGA parallelism. The architecture may be scalable to sort various data size, outputs the sorted indices, and may be scaled based on available resources of the FPGA.

Database-management systems may encode data using dictionary encoding to compress the data. The system may include a generic dictionary-decoding kernel to decode data to any data type. The system may use dictionary decoding as a first stage of a database sort to provide an input to a sort kernel. Additionally, dictionary decoding may be utilized to support sorting columns with non-numeric data types. The dictionary-decoding kernel of the system may be optimized to maximize the SSD-to-FPGA bandwidth utilization.

Shuffling may be a step of a database sort and may be I/O bounded. The system may accomplish table sort using a shuffle kernel that fully utilizes bandwidth of an SSD to maximize performance of sorting database tables. The storage pattern of the table may be modified to benefit from regular memory patterns in both shuffle and sort kernels.

Embodiments of the disclosure may include accelerator 135 of FIG. 1, which may be faster and more energy efficient than the same accelerator on conventional architectures that include a stand-alone FPGA and storage devices in which the FPGA may be connected to the system through a PCIe bus. The system may also be faster and more energy efficient when compared to a CPU baseline.

Database systems may be constrained by disk performance because operations on a database may involve large amounts of data. A database may include one or more tables, each with rows and columns in which each entry holds a specific attribute. Data encoding may be used to compress the table stored in the storage system. Dictionary encoding may be a common encoding method widely used in database-management systems. Unlike byte-oriented compression methods (e.g., gzip, snappy, run-length encoding) that may involve decompression as a blocking step before query execution, dictionary encoding may support parallel decoding and in-situ query processing. Sorting a database table based on a key column may involve the following three steps: decompressing the key column, if the database table is stored in a dictionary-encoded format; sorting the key column; and reordering the rest of the table correspondingly. The system may include three types of kernels: dictionary decoding, sort, and shuffle to execute each step. The system may perform all the computations on a computational storage device to eliminate host-storage communication.

The general architecture of a computational storage device, which may include storage device 120 of FIG. 1 and accelerator 135 of FIG. 1 as separate components or combined into a single device, may include the components of a general SSD, an SSD controller, and a NAND array, as well as an additional FPGA accelerator, a FPGA Dynamic Random Access Memory (DRAM), and a PCIe switch to set up the communication between the NAND array and the FPGA. The link between the FPGA and the SSD may provide direct communication between the computational storage device and a host. The SSD used by the computational storage device may be, for example, about a 4 TB SSD connected to, for example, a FPGA through a PCIe Gen3×4 bus interface.

In such a computational storage device, the processor may issue common SSD commands, such as SSD read/write requests to the SSD controller through the SSD driver. Furthermore, the processor may also be able to issue an FPGA computation request and FPGA DRAM read/write requests via a FPGA driver. In addition to host-driven commands, a computational storage device may support data movement over an internal data path between the NVMe SSD and the FPGA by using the FPGA DRAM and the on-board PCIe switch, which may be referred to herein as peer-to-peer (P2P) communication. The FPGA DRAM may be exposed to a host PCIe address space so that NVMe commands may securely stream data to the FPGA via the P2P communication. The P2P may bring the computations close to where the data may be residing, thereby reducing or eliminating the host-to-storage and the host-to-accelerator PCIe traffic, as well as related round-trip latencies and performance degradations. The computational storage device may provide a development environment and run-time stack, such as runtime library, API, compiler, and drivers to implement the FPGA-based designs.

Current databases may involve multiple devices to store the data. Such databases may be larger than what current commodity-hardware platforms may be able to cope with. Thus, database-management systems may partition the data into smaller chunks so that the computation nodes may execute the computations on each partition in a temporally-affordable manner. Thereafter, the management systems combine the result of each partition to generate a final result. Assuming that the data may be stored in SSDs, the tables of each SSD may be divided into a certain number of partitions. To sort the entire database, all the partitions of each SSD may be sorted and merged through the merge tree. Locally sorting each partition may be independent of the other partitions; therefore, locally different partitions may be sorted in parallel.

In sorting a database table, the system may utilize the storage bandwidth. Therefore, parallelizing multiple partitions on a single SSD may not be beneficial as it may not increase the performance: the FPGA may switch between partitions because it may not simultaneously access different partitions. Thus, the system may parallelize computations at the SSD-level. The system may deploy computational storage devices, each of which may be directly connected to an FPGA. Each computational storage device may sort an SSD-level partition independently of the computational storage device, which may significantly accelerate overall system performance as the number of storage devices grows.

Since accelerator 135 of FIG. 1 may include sort, shuffle, and dictionary-decoder kernels, the system may deal with a trade-off between allocating resources to the kernels. The dictionary-decoder kernel may be able to saturate the storage to FPGA bandwidth; thus, instantiating a single dictionary-decoder kernel may be sufficient to deliver maximum performance. A single-shuffle kernel may not fully utilize the SSD-to-FPGA bandwidth due to the fact that, although in the system a new table storage format enables reading a row in a sequential pattern, reading the next row still may involve a random memory access that has a high latency. Therefore, an aim may be to set the total input consumption rate for all the shuffle kernels to the maximum provided bandwidth of the SSD-to-FPGA to fully utilize bandwidth. Due to the fact that the shuffle operation may be I/O intensive and the size of the table may be significantly larger than the size of the key column, the performance of the shuffle operation may be determinative of the overall performance. Thus, multiple instances of the shuffle kernel may be instantiated to fully leverage the storage-to-FPGA bandwidth and a single instance of the dictionary-decoder kernel and to use the rest of the resources for the sort kernel. The storage-to-FPGA bandwidth may be fully utilized in the shuffle and dictionary-decoder kernel while still having sufficient resources to have a high-throughput sort. The sort kernel may use a great portion of the FPGA block RAM (BRAM) to store the arrays and may provide parallelism. Additionally, the dictionary-decoder kernel may involve on-chip memory to store the dictionary table locally to provide high throughput. Therefore, the dictionary decoder of the system may mostly use FPGA Ultra RAMs (URAMs) to balance the overall resource utilization of the system.

A bitonic sort may be a sorting network that may be run in parallel. In a sorting network, the number of comparisons and the order of comparisons may be predetermined and data-independent. Given a number and order of comparisons, a bitonic sort may be efficiently parallelized on FPGAs by utilizing a fixed network of comparators. A bitonic sort may first convert an arbitrary sequence of numbers into multiple bitonic sequences. By merging two bitonic sequences, a bitonic sort may create a longer bitonic sequence and may proceed until the entire input sequence is sorted. A sequence of length n may be a bitonic sequence if there is an i ($1 \leq i \leq n$) such that all the elements before the $i^{th}$ element are sorted ascending and all the elements after that are sorted descending: that is, $x_1 \leq x_2 \leq \ldots \leq x_i \geq X_{i+1} \geq x_{i+2} \geq \ldots \geq x_n$.

For example, to sort an example input sequence of length n=8 that includes n/2=4 bitonic sequences of length 2, the initial unsorted sequence may pass through a series of comparators that swap two elements to be in either increasing or decreasing order. The output of the first step may be n/4 bitonic sequences each of length 4. Applying a bitonic merge on the n/4 sequences creates n/2 bitonic sequences. The output sequence after applying $\log_2 n$ bitonic merge may produce the sorted sequence.

Generally, in the bitonic merge at the $i^{th}$ step (starting from i=1), $n/2^i$ bitonic sequences of length $2^i$ may be merged to create $n/2^{(i+1)}$ bitonic sequences of length $2^{(i+1)}$. The $i^{th}$ bitonic merge step itself may include i sequential sub-steps of element-wise comparison. In the first sub-step of the $i^{th}$ step, an element k may be compared with an element $k+2^{i-1}$, while the first $2^i$ elements may be sorted in ascending order and the next $2^i$ elements may be sorted in descending order (the sorting direction may change after every $2^i$ elements). In the aforementioned example, in the first sub-step of the last/third step, the first element may be compared with the $1+2^{3-1}=5^{th}$ element (with a value of 7). Generally, in the $j^{th}$ sub-step ($1 \leq j \leq i$) of the $i^{th}$ main step, element k may be compared with the element $k+2^{i-j}$. Thus, in the second sub-step of the third step, the first element may be compared to the $1+2^{3-2}=2^{nd}$ element.

To sort a database table, the system may begin with sorting the key column. As mentioned earlier, the sequence of operations in a bitonic sort may be predefined, data-independent, and parallelizable. Therefore, the system may take advantage of FPGA characteristics to accelerate a bitonic sort. The input sequence may be stored in the FPGA DRAM, also referred as "off-chip memory." Then, the system may stream the input sequence into the FPGA through a port, such as an Advanced Extensible Interface (AXI) port, which has an interface data width of 512 bits (16 32-bit integers). The AXI port may write the data to the input buffer, which may have a capacity of $P=2^m$ integer numbers. To have a regular sort network, without lack of generality, P, the size of bitonic-sort kernel, may be a power-of-two number (padding may be used if the total data elements is not a multiple of P). If P may be greater than 16, it may take multiple cycles to fill the input buffer. Whenever the input buffer fills, the input buffer passes the buffered inputs to the P-sorter module.

The P-sorter may be implemented in parallel and may include $\log_2 P$ steps. The P-sorter module may be pipelined to meet a timing requirement of the FPGA and may be able to provide a throughput of one sorted sequence (of size P) per cycle. The first step in the P-sorter may compare elements of even indices (2k-indexed elements) with a successor element. Thus, the first step may involve P/2 Compare-and-Swap (CS) modules. During a second step, the P-sorter may first compare and swap elements with indices 4k with 4k+2, and 4k+1 with 4k+3. Afterwards, the P-sorter may compare and swap 2k elements with 2k+1 elements of the updated array. Therefore, the second step in the P-sorter may involve P/2+P/2=P instances of the CS module. Analogously, the $i^{th}$ step in the P-sorter in which $1 \leq i \leq \log_2 P$ should involve i×P/2 CS modules. The total number of CS modules that should be involved for the P-sorter may be estimated as $n_{CS}$=P/2+(2×P/2)+ . . . +(log$_2$ P×P/2)≅P/4×log$_2$ P The system may orchestrate a sort operation on the entire data by leveraging the P-sorter modules and the fast on-chip memory of the FPGA. First, when sorting every P elements, the P-sorter may toggle between ascending and descending orders. The sorted output of P-sorter modules may be written into a sequence memory, which may include two sub-memory blocks, $M_1$ and $M_2$, that are made up of FPGA BRAMs. Initially, the ascending and descending sorts may be respectively written in $M_1$ and $M_2$. Each row of $M_1$ and $M_2$ may include P elements that together form a bitonic row (as the first half is ascending and the second half is descending) in the sequence memory with a length of 2P. Note that, by row refers to adjacent placements of items in a sequence, not necessarily a physical row of a block RAM that may just fit one or two integers. Since the 2P sequence may be just a single bitonic array, using a merging procedure the 2P bitonic array may be sorted using P×log$_2$ 2P) compare-and-swap (CS) units.

Merging the results of P-sorters is itself a bitonic-like procedure, but on sorted arrays rather than scalar elements. That is, step 1 may be similar to step 1 in a bitonic sort, merging the adjacent arrays. Step 2 may be similar to the second step of a simple bitonic sort that compares and swaps every item i with item i+2 using Parallel Compare-and-Swap (PCS) units, followed by comparing item i with item i+1 in the modified array. Thus, the entire sort may be considered to be as an intra-array followed by an inter-array bitonic sort. When the system accomplishes sorting an entire sequence memory, the system may write the sequence back into the off-chip DRAM (or back to the storage device) and uses the same flow to fetch and sort another chunk of the input sequence repetitively and then merges the chunks to build larger sorted chunks.

To provide a desired bandwidth for the parallelization, each of the $M_1$ and $M_2$ memory blocks may use P columns of BRAMs in parallel, so P integers may be fetched at once (the data width of FPGA BRAMs may be 32 bit or one integer). Also, in each memory block, L rows of BRAMs may be placed vertically so the results of L sorters may be compared simultaneously. The number of BRAMs and their capacity in terms of 32-bit integers number may be formulated as $n_{BRAM}$=2 ×P×L and $C_{BRAM}$=1024×2 ×P×L.

Note that BRAMs may have a 1024 bit (depth) by 32 bit (width) configuration. At each iteration, $C_{BRAM}$=2048PL integers may be sorted and written back to the off-chip DRAM.

To sort a database table, the rest of the table rows may be reordered based on the indices of the sorted key column, referred to herein as sorted indices. Thus, the sorted indices may be generated that later may be used by the shuffle kernel to sort the entire table. To this end, when reading an input sequence from DRAM, an index may be assigned to each element and the indices may be stored in an index memory that has the same capacity as the sequence memory. When reading from the sequence memory and feeding inputs to the P-sorter, the system may read the corresponding index and concatenates to the value. The compare-and-swap units of P-sorters may perform the comparison merely based on the value part of the concatenated elements, but the entire concatenated element may be swapped. The system, therefore, may store the sorted indices in the DRAM as well.

The P-sorter module may sort chunks of elements and may store in the following sequence memory. The $M_1$ memory group may store the ascending sorts while $M_2$ may store the descending sorted elements. There are P BRAMs at every row of the $M_1$ (and $M_2$) memory, so the sorted P elements may be partitioned element-wise for subsequent parallel operations. In the PCS sub-steps, two P-element arrays from the same memory (either $M_1$ or $M_2$) may be fetched while in the last sub-step (i.e., merge), a P-element array from $M_1$ and another from $M_2$ may be fetched and sorted/merged. L-to-1 multiplexers that are connected to all L BRAM groups may be used to manage these operations, and up to two arrays may be selected from each of $M_1$ and $M_2$. The PCS and merge modules' outputs may be written back in the sequence memory to accomplish the next steps.

After sorting the key column, the system may use a shuffle kernel to reorder the table rows. To implement this operation, the system may read the value of the first element of the sorted key column as well as its index in the original table (which may be concatenated to the value of elements). Then, the system may read all the entries of the original row that the index points to and may write it as the first row of the new sorted table. Analogously, to generate the $i^{th}$ row of the sorted table, the system may read the $i^{th}$ element of the sorted indices sequence. The index represents the index of the row in the original table. Thus, the mapping between the original table and the sorted one may be formulated as SortedTable [i]=OriginalTable(SortedIndices[i]).

The shuffle kernel does not necessarily perform any computation; hence, the performance of the kernel may be bounded by the memory access time. Storing the tables in the storage, therefore, may directly affect the performance of the kernel. Typically, tables may be stored in either column-wise or row-wise format. In the column-wise format, elements of every column may be stored in consecutive memory elements. In the row-wise format, all the elements of a row may be placed in successive memory elements. Consecutive memory elements may be transferred to the FPGA from DRAM in a burst mode significantly faster than scattered (random) accesses.

Storing the table in a column-wise format may result in a sequential/burst memory access pattern in the sort kernel (because it involves access to the consecutive elements of the key column, which may be denoted as $C_k$). However, the shuffle kernel may have random access patterns (as the shuffle kernel uses access to the consecutive elements of the same row, which may be placed distantly in the column-wise arrangement). Analogously, storing the table in row-wise format may enable sequential access patterns to read a single row (suitable for the shuffle kernel), but reading the next row (as part of a sort kernel) may involve random memory access. To optimize the access patterns of both kernels, the system may use a hybrid technique for storing the table in the storage. The key column ($C_k$) may be stored column-wise while the rest of the table may be stored in row-based format. Therefore, both kernels may benefit from sequential memory accesses.

In database-management systems, data may be stored compressed in the storage system to reduce the number of storage devices used to store the database. Dictionary encoding may be used as a stand-alone compression technique or as a step combined with other compression techniques. Dictionary encoding may be a lossless compression technique that maps each "value" to a "key". Using dictionary encoding may be beneficial when the range of the numbers may be significantly greater than the number of unique values (U). Each unique value may be represented by a k-bit key in which k=$\log_2$ U. Dictionary encoding may be beneficial when the size of the encoded data is considerably smaller than the total size of the elements. Dictionary encoding may be more effective for data types with greater sizes. A dictionary-decoding accelerator may only support decoding values having fixed-length data types. However, dictionary encoding may be more effective in encoding variable-length data types, such as strings. The system may include an accelerator for dictionary decoding that supports all data types (both fixed- and variable-length data types).

If the data is stored in the storage devices in the encoded format, even though some database operations (e.g., filter or shuffle) may be run on the dictionary encoded data to perform sort operation on the table, the data should be decoded first. The dictionary decoder of the system, which may be implemented using accelerator 135 of FIG. 1, may first read the "dictionary page," which is stored along with the encoded data, from the storage device. It may store the dictionary page in the FPGA local BRAM to provide fast access to decode the inputs. Since the length of values may be different, in variable-length data types, such as string; the system may not store a single value in every row of the on-chip dictionary table to fully utilize the capacity of limited FPGA BRAMs. A dictionary table of the system may include R rows in which each row may be $L_{max}$ bytes. $L_{max}$ may be the number of bytes of the longest value in the dictionary. The dictionary decoder of the system may concatenate the dictionary values and may write them in the dictionary table consecutively. As a result, bytes of a dictionary value may split in two consecutive rows of the dictionary table. Since the length of each row may be equal or greater than the length of every dictionary value, each value may either be stored in a single row, or split into two consecutive rows. To find the location and length of the value corresponding to a key, the dictionary decoder of the system constructs the index memory, which may store the byte address and the length of every dictionary value in the dictionary table. The dictionary decoder of the system may use the input key to look up the index and the length of the corresponding value. Then, the system may use the index and the length to read the value from the byte addressable dictionary table. As there may be multiple accesses to both index memory and dictionary table in every clock cycle, the system may use on-chip memory to store the two tables.

The dictionary decoder of the system, which may be implemented using accelerator 135 of FIG. 1, after constructing the index memory and the dictionary table, may stream in the data page, decode the data page, and write the decoded data to the FPGA DRAM. As the decoded data may be used in the sort kernel, the system may keep the decoded data into the FPGA DRAM to avoid unnecessary storage accesses. The width of the input elements (k) may depend on the number of unique elements in the dictionary (U), and the width of the decoded elements may depend on the original data type. The system may provide a generic dictionary decoder that supports various input and output bit widths that may be configured during the runtime. The dictionary decoder of the system, after loading the dictionary, may stream in the data page using the AXI interface. For the sake of design simplicity and AXI compatibility, the dictionary decoder of the system may limit the input bit widths k to power-of-two numbers that are greater than eight. The AXI interface may read the encoded data page elements and may store the encoded data page elements in the input buffer. Input keys may be associated with values with different bit widths. Thus, to support decoding to different data types, the dictionary table may support the reading and writing element with different bit widths.

Embodiments of the disclosure may include accelerator 135 of FIG. 1, which may stream in the input keys and may store the input keys in the input buffer. The system may look up the location and length of the corresponding value in the dictionary table from the index memory. The index memory may output the byte address of the first byte of the value in the dictionary table as well as the length of the value. The byte address may be used to find the row address of the dictionary memory that contains the value. A dictionary value may either be entirely store in a dictionary table row or it may be split into two consecutive rows. Therefore, for each key, the address generator may output the row address that contains the first byte of the value and the next row. The system may read two rows of the dictionary table and may write them into an output filtering module. The output filtering may use the byte address and the length of the value to find and filter the value corresponds to the input key. The output filtering module may output the dictionary value and may write it into the parallel buffers in the output buffer module. The output buffer module may aggregate multiple values and may transfer them to the FPGA off-chip DRAM.

As an example, a dictionary page might include values that are a maximum of 8 bytes wide. Therefore, each row of the dictionary table may include 8 bytes. The content of the index memory may be constructed during the runtime. The first byte of the first value may start at address 0, and the value may be, for example, 3 bytes long. The next value may start at address 3 in the dictionary table and may be 4 bytes long. For each value, the pointer may be the accumulation of all the previous lengths, and the length represents the size of the value in bytes. The address generator module may use the byte address to find the row addresses that contain the value. To get the row address, the address generator may shift the byte address to right for $\log_2$ MS, where MS may be the maximum string length. Then the shifted value its next rows will be the row addresses that contain the value. The [MS−1:0] bits of the byte address may be used in the output filtering module to extract the value from the two rows read from the dictionary table. For instance, for some value the byte address and the length parameters might be 14 and 6, respectively. The first byte of the value may starts at address 14. The address generator may shift the byte address to right for three bits ($\log_2$ 8), which returns the row address of 14>>3=1: in other words, the desired value is in rows 1 and 2. The system may read rows 1 and 2 from the dictionary table and may write them into the output filtering module. Bits [2:0] of the byte address may be used as an offset from the first byte of the read rows. The value may starts at the byte offset and ends after length bytes. In this example, the offset may be equal to 6 and the length may be equal to 6, which means the value is between bytes 6 to 11. The output filtering module may extract the value from the read rows, and may write it into parallel output buffers. The system may use multiple parallel buffers to increase the output bandwidth utilization and, consequently, increase the performance by writing multiple bytes in each cycle. However, because the length of values varies, the output buffer module may concatenate the consecutive values and may write them into P parallel buffers and whenever, all the P buffers have an element in them, it may transfer the P bytes into the FPGA DRAM.

Database-management systems may frequently use dictionary encoding to store the data. The system not only ay sort columns of integer and long data types, it also may support sorting columns with any data types if the column is stored in a dictionary encoded format. Dictionary encoding may represent values with any data types with integer keys. The system may use a method to sort the dictionary encoded column by leveraging the sort and dictionary-decoding kernels. The table may be stored in the storage system and the column based on which table that is going to be sorted is dictionary may be encoded. Note that the rest of the columns may be stored in either dictionary encoded or in plain format. First, the system may read the dictionary page of the column on the host server: the size of the dictionary table may be significantly less than the size of the original column. Database-management systems may use dictionary encoding when the number of unique elements (size of the dictionary) may be significantly less than the number of elements in the column. Thus, sorting the dictionary page may take significantly less time than sorting the column considering the size of the arrays and non-linear complexity of the sort operation. Therefore, the system may take advantage of the host server to sort the dictionary table due to the efficiency of sorting small arrays on general-purpose processors. The host machine may sort the dictionary table based on the values and assigns new keys, referred to herein as mapped keys, to the sorted values. The host server may also generate a key mapping table that may map the keys of the original dictionary encoding to the keys of the sorted dictionary table. The system may use the sorted dictionary table and key mapping table in a generic sort flow. The system may use the key mapping table to map the input data to the mapped key array. In this mapping, the order of the keys may be the same as the order of the sorted values. For instance, if a column is sorted in ascending order, the greater key, corresponds to a value that is greater in the sorted order.

The host program may read the dictionary page from the storage system, sorts the dictionary table, generates the key mapping table and transfers both sorted dictionary table and key mapping table to the FPGA DRAM. The FPGA may read the data page directly from the storage device to eliminate the overhead of transferring the data page through the host server. A generic-sort method of the system may be a flow of data that utilizes the sort kernel and the dictionary-decoder kernel to sort a column with any data types and may use the shuffle kernel to sort the entire table based on the sorted column. First, the system may load the key mapping table, and then may stream in the data page. Then, the system may map the input keys to mapped keys using the key mapping table. The system may initiate the sort kernel of the system to sort the mapped key. Sorting the mapped key may be equivalent to sorting the original data because the order of the mapped keys may be the same as the order of the values in the sorted array. The system sort kernel may sort the mapped key array and may write it into the sorted mapped key array. The system may use the dictionary-decoder kernel to decode the sorted mapped key array to the sorted array in the original data type.

As an example, consider a column of strings. The string column may be dictionary encoded, and stored in the storage as {0, 2, 4, 1, 3}, and the dictionary page may be stored along with the data page. Note that, in this example for simplicity a small column is used; however, in real-world applications, the data page size may be significantly larger than the dictionary page. The system may offload sorting the dictionary page and may generate the key mapping table to the host server. The host may transfer the two tables and may send them to the FPGA DRAM. In this example, the system may sort the data page in an ascending order. For example, the original dictionary-encoded data may map the string "USA" to the key 0, but after sorting the dictionary table, the string "USA" may be the last element of all the values. The key mapping table may map key 0 to mapped key 4, which means the value corresponding to any key less than 4 may come earlier in the sorted data in the original data type. The system may read the data and may mapped the data into the mapped-key array. The system may then sort the mapped key array and may store the data into the sorted mapped-key array. The system may use the sorted dictionary table to decode the sorted mapped-key array to the original data type. For example, as discussed above, the key 0 in the original dictionary page may correspond to the dictionary value "USA". Since "USA" may come last when the data is sorted, the system may map keys 0 to mapped keys 4. Then, in the sorted mapped key array the element 4 becomes the last element. The system may decode the sorted mapped key array and the last element may be decoded to the string "USA".

Embodiments of the disclosure offer technical advantages over the prior art. By using an accelerator, dictionary decoding may be performed closer to the data, which may reduce the load on the host processor, as well has reducing the amount of data to be sent between the storage device and the host processor. Further, by making the accelerator configurable to use with any dictionary, the accelerator may be reused simply by loading a new dictionary page and adjusting the widths of the encoded and decoded values.

The following discussion is intended to provide a brief, general description of a suitable machine or machines in which certain aspects of the disclosure may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present disclosure may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the disclosure may include a tangible, non-transitory machine-readable medium comprising instructions executable by one or more processors, the instructions comprising instructions to perform the elements of the disclosures as described herein.

The various operations of methods described above may be performed by any suitable means capable of performing the operations, such as various hardware and/or software component(s), circuits, and/or module(s). The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Having described and illustrated the principles of the disclosure with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the disclosure" or the like are used herein, these phrases are meant to generally reference embodiment possibilities, and are not intended to limit the disclosure to particular embodiment configurations. As used herein, these terms may reference the same or different embodiments that are combinable into other embodiments.

The foregoing illustrative embodiments are not to be construed as limiting the disclosure thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this disclosure as defined in the claims.

Consequently, in view of the wide variety of permutations to the embodiments described herein, this detailed description and accompanying material is intended to be illustrative only, and should not be taken as limiting the scope of the disclosure. What is claimed as the disclosure, therefore, is all such modifications as may come within the scope and spirit of the following claims and equivalents thereto.

What is claimed is:

1. An accelerator, comprising:
a memory configured to store a dictionary table;
an address generator configured to generate an address in the dictionary table in the memory based at least in part on an encoded value, the encoded value with an encoded width; and
an output filter configured to filter a decoded value from an entry in the dictionary table based at least in part on a starting location within the entry, the entry including the decoded value and at least a first part of a second decoded value, the entry and the starting location identified based at least in part on the address, the decoded value with a decoded width,
wherein the accelerator is configured to support at least two different encoded widths.

2. The accelerator according to claim 1, wherein the accelerator is configured to read a dictionary page from a storage device and store the dictionary page in the dictionary table in the memory.

3. The accelerator according to claim 1, wherein the accelerator is configured to read an encoded data page from a storage device, decode the encoded data page to produce a decoded data page, and write the decoded data page to a second memory of the storage device.

4. The accelerator according to claim 1, wherein:
the address generator includes a shift module configured to shift the encoded value based at least in part on a number of bits to produce a row number;
the accelerator further comprises a table read module configured to read the entry from the dictionary table based at least in part on the row number; and
the output filter is configured to filter the entry to produce the decoded value.

5. The accelerator according to claim 1, wherein the memory is configured to store the dictionary table and at least one second dictionary table.

6. The accelerator according to claim 1, wherein the decoded data is a fixed length data type.

7. The accelerator according to claim 1, wherein the dictionary table is byte-addressable.

8. An accelerator according to claim 1, wherein the output filter includes a table, the table mapping the address to a row in the dictionary table and an offset in the row in the dictionary table.

9. A method, comprising:
reading a dictionary page from a storage device into a memory in an accelerator, the dictionary page including an entry mapping an encoded value with an encoded width to a decoded value with a decoded width, the entry including the decoded value and at least a first part of a second decoded value;
reading an encoded data page from the storage device;
accessing the encoded value from the encoded data page;
mapping the encoded value to the decoded value using the accelerator using the entry in the dictionary page; and replacing the encoded value in the encoded data page with the decoded value to produce a decoded data page,
wherein the accelerator is configured to support at least two different encoded widths.

10. The method according to claim 9, further comprising storing the decoded data page in a second memory in the storage device.

11. The method according to claim 9, further comprising sending the decoded data page to a second memory of a host machine.

12. The method according to claim 9, wherein reading the dictionary page from the storage device includes:
storing the dictionary page in a dictionary table in the memory in the accelerator;
determining the encoded width of the encoded value;
determining the decoded width of the decoded value; and
configuring the accelerator to locate the decoded value based at least in part on the encoded value, the encoded width, and the decoded width.

13. The method according to claim 12, wherein configuring the accelerator to locate the decoded value based at least in part on the encoded value, the encoded width, and the decoded width includes:
determining a number of bits representing a number of unique values stored in the entry of the dictionary table;
shifting the encoded value based at least in part on the number of bits to produce a row number;
reading the entry from the dictionary table associated with the row number; and
using the number of bits to filter the decoded value from the entry.

14. The method according to claim 13, wherein reading the entry from the dictionary table associated with the row number includes reading a second entry from the dictionary table associated with an adjacent row number.

15. The method according to claim 14, wherein using the number of bits to filter the decoded value from the entry includes using the number of bits to filter the decoded value from the entry and the second entry.

16. A method according to claim 9, wherein the storage device includes a Solid State Drive (SSD).

17. A method according to claim 9, wherein mapping the encoded value to the decoded value using the accelerator includes generating an address based at least in part on the encoded value, the address identifying an entry in the dictionary table including at least a part of the decoded value and a starting location within the entry for the decoded value.

18. A method according to claim 17, wherein generating the address based at least in part on the encoded value includes:
determining the entry in the dictionary page including at least part of the decoded value based at least in part on the address;
determining the starting location within the entry for the decoded value based at least in part on the address.

19. An article, comprising a non-transitory storage medium, the non-transitory storage medium having stored thereon instructions that, when executed by a machine, result in:
reading a dictionary page from a storage device into a memory in an accelerator, the dictionary page including an entry mapping an encoded value with an encoded width to a decoded value with a decoded width, the entry including the decoded value and at least a first part of a second decoded value;
reading an encoded data page from the storage device;
accessing the encoded value from the encoded data page;
mapping the encoded value to the decoded value using the accelerator using the entry in the dictionary page; and
replacing the encoded value in the encoded data page with the decoded value to produce a decoded data page,
wherein the accelerator is configured to support at least two different encoded widths.

20. The article according to claim 19, the non-transitory storage medium having stored thereon further instructions that, when executed by the machine, result in storing the decoded data page in a second memory in the storage device.

21. The article according to claim 19, the non-transitory storage medium having stored thereon further instructions that, when executed by the machine, result in sending the decoded data page to a second memory of a host machine.

22. The article according to claim 19, wherein reading the dictionary page from the storage device includes:
storing the dictionary page in a dictionary table in the memory in the accelerator;
determining the encoded width of the encoded value;
determining the decoded width of the decoded value; and
configuring the accelerator to locate the decoded value based at least in part on the encoded value, the encoded width, and the decoded width.

23. The article according to claim 22, wherein configuring the accelerator to locate the decoded value based at least in part on the encoded value, the encoded width, and the decoded width includes:
determining a number of bits representing a number of unique values stored in the entry of the dictionary table;
shifting the encoded value based at least in part on the number of bits to produce a row number;
reading the entry from the dictionary table associated with the row number; and
using the number of bits to filter the decoded value from the entry.

24. The article according to claim 23, wherein reading the entry from the dictionary table associated with the row number includes reading a second entry from the dictionary table associated with an adjacent row number.

* * * * *